(12) United States Patent
Morisaki et al.

(10) Patent No.: US 11,735,514 B2
(45) Date of Patent: Aug. 22, 2023

(54) SEMICONDUCTOR DEVICE AND POWER CONVERSION DEVICE

(71) Applicant: Mitsubishi Electric Corporation, Tokyo (JP)

(72) Inventors: Shota Morisaki, Tokyo (JP); Seiji Oka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 116 days.

(21) Appl. No.: 17/608,148

(22) PCT Filed: Jun. 26, 2019

(86) PCT No.: PCT/JP2019/025386
§ 371 (c)(1),
(2) Date: Nov. 2, 2021

(87) PCT Pub. No.: WO2020/261433
PCT Pub. Date: Dec. 30, 2020

(65) Prior Publication Data
US 2022/0230953 A1    Jul. 21, 2022

(51) Int. Cl.
*H01L 25/07* (2006.01)
*H01L 23/50* (2006.01)
*H02P 27/08* (2006.01)

(52) U.S. Cl.
CPC ............ *H01L 23/50* (2013.01); *H01L 25/072* (2013.01); *H02P 27/08* (2013.01)

(58) Field of Classification Search
CPC . H01L 23/50; H01L 25/072; H01L 23/49811; H01L 24/06; H01L 2224/0603;
(Continued)

(56) References Cited

U.S. PATENT DOCUMENTS

2008/0049476 A1    2/2008  Azuma et al.
2014/0159225 A1    6/2014  Zushi et al.

FOREIGN PATENT DOCUMENTS

JP    2005-347561 A    12/2005
JP    2008-29117 A     2/2008
(Continued)

OTHER PUBLICATIONS

International Search Report and Written Opinion dated Sep. 3, 2019, received for PCT Application PCT/JP2019/025386, Filed on Jun. 26, 2019, 10 pages including English Translation.

*Primary Examiner* — Elias Ullah
(74) *Attorney, Agent, or Firm* — Xsensus LLP

(57) ABSTRACT

A semiconductor device includes: a first power supply terminal; a second power supply terminal; an output terminal; a first switching element connected between the first power supply terminal and the output terminal; and a second switching element connected between the second power supply terminal and the output terminal. The first power supply terminal includes: a first facing portion; a second facing portion; and a third facing portion. The first facing portion and the second facing portion are provided such that, upon application of a current, the current flows through the first facing portion and the second facing portion in a direction opposite to a direction in which the current flows through each of portions in the second power supply terminal that face the first facing portion and the second facing portion.

20 Claims, 24 Drawing Sheets

(58) Field of Classification Search
CPC . H01L 2224/49113; H01L 2924/00014; H01L 2924/19107; H01L 24/49; H01L 25/18; H01L 2224/49111; H02P 27/08; H02M 7/48

See application file for complete search history.

(56) References Cited

FOREIGN PATENT DOCUMENTS

| | | |
|---|---|---|
| JP | 2013-45974 A | 3/2013 |
| JP | 2013-222885 A | 10/2013 |

SEMICONDUCTOR DEVICE AND POWER CONVERSION DEVICE

CROSS-REFERENCE TO RELATED APPLICATION

The present application is based on PCT filing PCT/JP2019/025386, filed Jun. 26, 2019, the entire contents of which are incorporated herein by reference.

TECHNICAL FIELD

The present invention relates to a semiconductor device and a power conversion device.

BACKGROUND ART

As a semiconductor device used in a power conversion device, a semiconductor device made by using silicon carbide (SiC) as a semiconductor material has conventionally been proposed. Such a semiconductor device is higher in switching speed than a semiconductor device made by using silicon (Si) as a semiconductor material. Accordingly, during the turn-off operation, the current rapidly decreases to reduce switching loss, but the surge voltage at switching increases.

Thus, a semiconductor device is known, which includes a positive electrode terminal and a negative electrode terminal that are partially stacked on one another to form parallel plate regions in order to reduce a surge voltage (for example, see PTL 1). In such a semiconductor device, a current flows through one of these two stacked parallel plate regions in a direction opposite to a direction in which a current flows through the other of the stacked parallel plate regions, and thereby, the inductances in the positive electrode terminal and the negative electrode terminal decrease.

CITATION LIST

Patent Literature

PTL 1: Japanese Patent Laying-Open No. 2013-222885

SUMMARY OF INVENTION

Technical Problem

However, the semiconductor device disclosed in PTL 1 includes the positive electrode terminal and the negative electrode terminal that only face each other, and this facing area includes only: first flat plate regions facing each other in the vertical direction; and curved regions facing each other in the longitudinal direction of the first flat plate regions.

In the above-described semiconductor device, the portion in which the positive electrode terminal and the negative electrode terminal face each other is limited. Thus, further increasing the switching speed and still suppressing an increase in surge voltage caused thereby are difficult to achieve.

A main object of the present invention is to provide a semiconductor device and a power conversion device that are capable of further increasing a switching speed for the semiconductor device as compared with conventional semiconductor devices, and still capable of suppressing an increase in surge voltage caused by increasing the switching speed.

Solution to Problem

A semiconductor device according to the present invention includes: a first power supply terminal; a second power supply terminal; an output terminal; at least one first switching element connected between the first power supply terminal and the output terminal; and at least one second switching element connected between the second power supply terminal and the output terminal. The first power supply terminal includes: a first facing portion disposed at a distance from the second power supply terminal in a first direction and disposed to extend in a second direction crossing the first direction; a second facing portion disposed at a distance from the second power supply terminal in the second direction and disposed to extend in the first direction; and a third facing portion disposed at a distance from the second facing portion in the second direction and disposed to extend in the first direction. The first facing portion and the second facing portion are provided such that, upon application of a current, the current flows through the first facing portion and the second facing portion in a direction opposite to a direction in which the current flows through each of portions in the second power supply terminal that face the first facing portion and the second facing portion. The second facing portion and the third facing portion are provided such that, upon application of a current, the current flows through the second facing portion in a direction opposite to a direction in which the current flows through the third facing portion.

Advantageous Effects of Invention

According to the present invention, a semiconductor device and a power conversion device can be provided that are capable of further increasing a switching speed for the semiconductor device as compared with conventional semiconductor devices, and still capable of suppressing an increase in surge voltage caused by increasing the switching speed.

DESCRIPTION OF EMBODIMENTS

Figure 1:
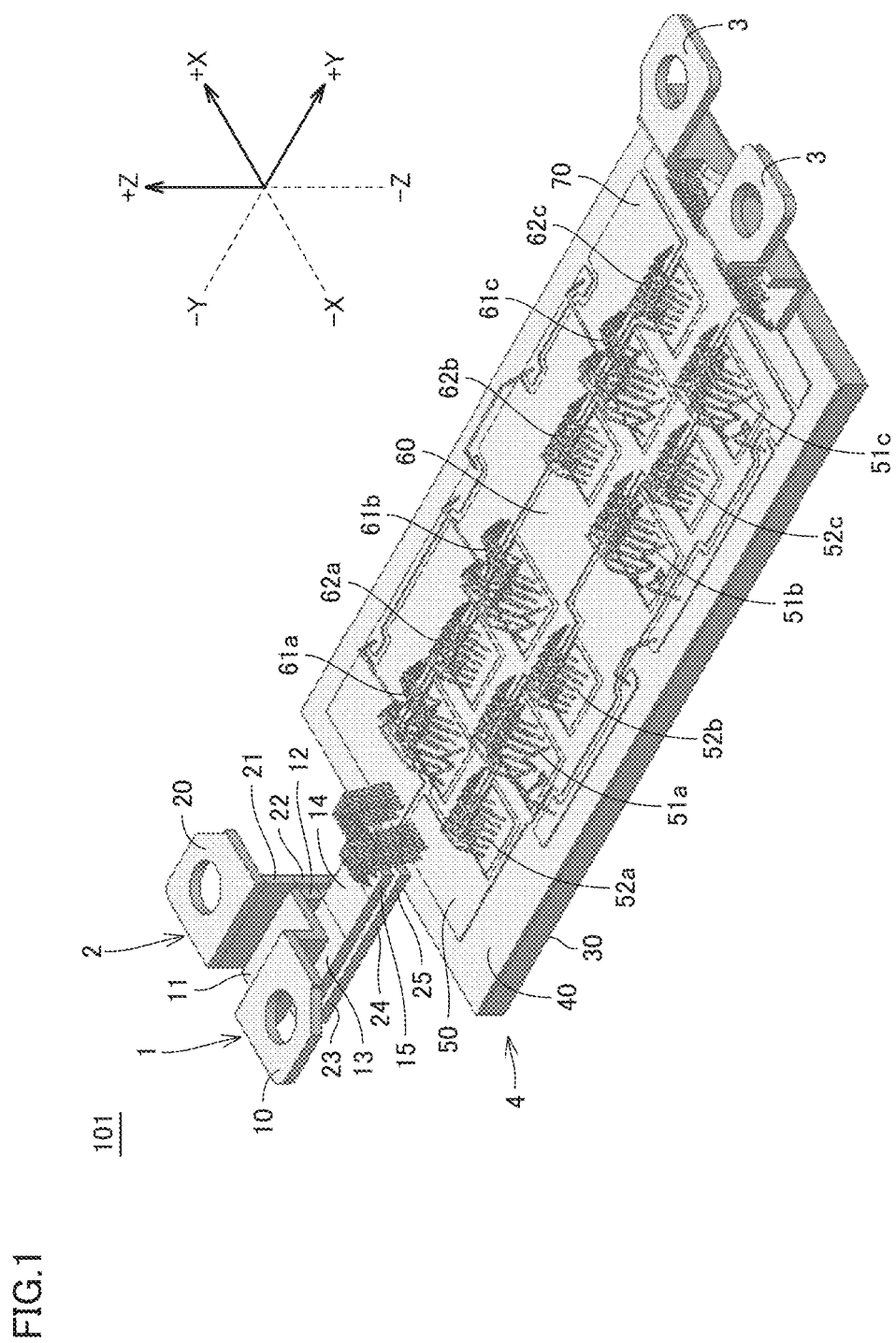
FIG. 1 is a perspective view of a semiconductor device according to a first embodiment.

The embodiments of the present invention will be hereinafter described with reference to the accompanying drawings, in which the same or corresponding portions are denoted by the same reference characters, and the description thereof will not be repeated. The following description employs an X direction as the first direction, a Z direction as the second direction, and a Y direction as the third direction, for the sake of convenience. Further, the direction from one side to the other side in the X direction is defined as a +X direction while the direction opposite to the +X direction is defined as a −X direction. Similarly, the direction from one side to the other side in the Y direction is defined as a +Y direction while the direction opposite to the +Y direction is defined as a −Y direction. The direction from one side to the other side in the Z direction is defined as a +Z direction while the direction opposite to the +Z direction is defined as a −Z direction.

First Embodiment

As shown in FIG. 1, a semiconductor device 101 mainly includes a first power supply terminal 1, a second power supply terminal 2, an output terminal 3, and a base plate 4. First power supply terminal 1 is, for example, a positive electrode-side terminal connected to a positive electrode of a power supply. Second power supply terminal 2 is, for example, a negative electrode-side terminal connected to a negative electrode of the power supply. Output terminal 3 is an output terminal connected, for example, to a motor or the like.

Base plate 4 includes a substrate 30, an insulating layer 40, a first conductor pattern 50, a plurality of first switching elements 51a to 51c, a plurality of first diode elements 52a to 52c, a second conductor pattern 60, a plurality of second switching elements 61a to 61c, a plurality of second diode elements 62a to 62c, and a third conductor pattern 70.

Substrate 30 has a surface extending in the X direction and the Y direction. Insulating layer 40 is formed on the surface of substrate 30. First conductor pattern 50, second conductor pattern 60, and third conductor pattern 70 are arranged side by side on insulating layer 40. First conductor pattern 50, second conductor pattern 60, and third conductor pattern 70 are spaced apart from each other in the X direction. First conductor pattern 50, second conductor pattern 60, and third conductor pattern 70 each extend in the Y direction.

First power supply terminal 1 is connected to first conductor pattern 50, for example, via a bonding wire. Second power supply terminal 2 is connected to third conductor pattern 70, for example, via a wire bond. Output terminal 3 is connected to second conductor pattern 60, for example, via a wire bond. First power supply terminal 1, second power supply terminal 2, and output terminal 3 are disposed to sandwich base plate 4 between output terminal 3 and each of first power supply terminal 1 and second power supply terminal 2 in the Y direction. Semiconductor device 101 includes a plurality of output terminals 3, for example. The plurality of output terminals 3 are arranged side by side in the X direction. One output terminal 3 is arranged side by side with first power supply terminal 1 in the Y direction, and another output terminal 3 is arranged side by side with second power supply terminal 2 in the Y direction. The configuration and the arrangement of each of first power supply terminal 1 and second power supply terminal 2 will be described later in detail.

The plurality of first switching elements 51a to 51c and the plurality of second switching elements 61a to 61c each may be any fully controllable power semiconductor element, but each are a metal-oxide-semiconductor field-effect transistor (MOSFET), for example. The semiconductor material forming first switching elements 51a to 51c and second switching elements 61a to 61c includes silicon carbide (SiC).

The plurality of first switching elements 51a to 51c and the plurality of first diode elements 52a to 52c are arranged side by side on first conductor pattern 50 in the Y direction. Each of sources of the plurality of first switching elements 51a to 51c is connected to second conductor pattern 60, for example, via a wire bond. Each of drains of the plurality of first switching elements 51a to 51c is connected to first conductor pattern 50, for example, via solder. Each of anodes of the plurality of first diode elements 52a to 52c is connected to second conductor pattern 60, for example, via a wire bond. Each of cathodes of the plurality of first diode elements 52a to 52c is connected to first conductor pattern 50, for example, via solder.

The plurality of second switching elements 61a to 61c and the plurality of second diode elements 62a to 62c am arranged side by side on second conductor pattern 60 in the Y direction. Each of sources of the plurality of second switching elements 61a to 61c is connected to third conductor pattern 70, for example, via a wire bond. Each of drains of the plurality of second switching elements 61a to 61c is connected to second conductor pattern 60, for example, via solder. Each of anodes of the plurality of second diode elements 62a to 62c is connected to third conductor pattern 70, for example, via a wire bond. Each of cathodes of the plurality of second diode elements 62a to 62c is connected to second conductor pattern 60, for example, via solder.

In other words, first conductor pattern 50 connected to first power supply terminal 1 and second conductor pattern 60 connected to output terminal 3 are connected through the plurality of first switching elements 51a to 51c and the plurality of first diode elements 52a to 52c. Third conductor pattern 70 connected to second power supply terminal 2 and second conductor pattern 60 connected to output terminal 3 are connected through the plurality of second switching elements 61a to 61c and the plurality of second diode elements 62a to 62c.

Figure 2:
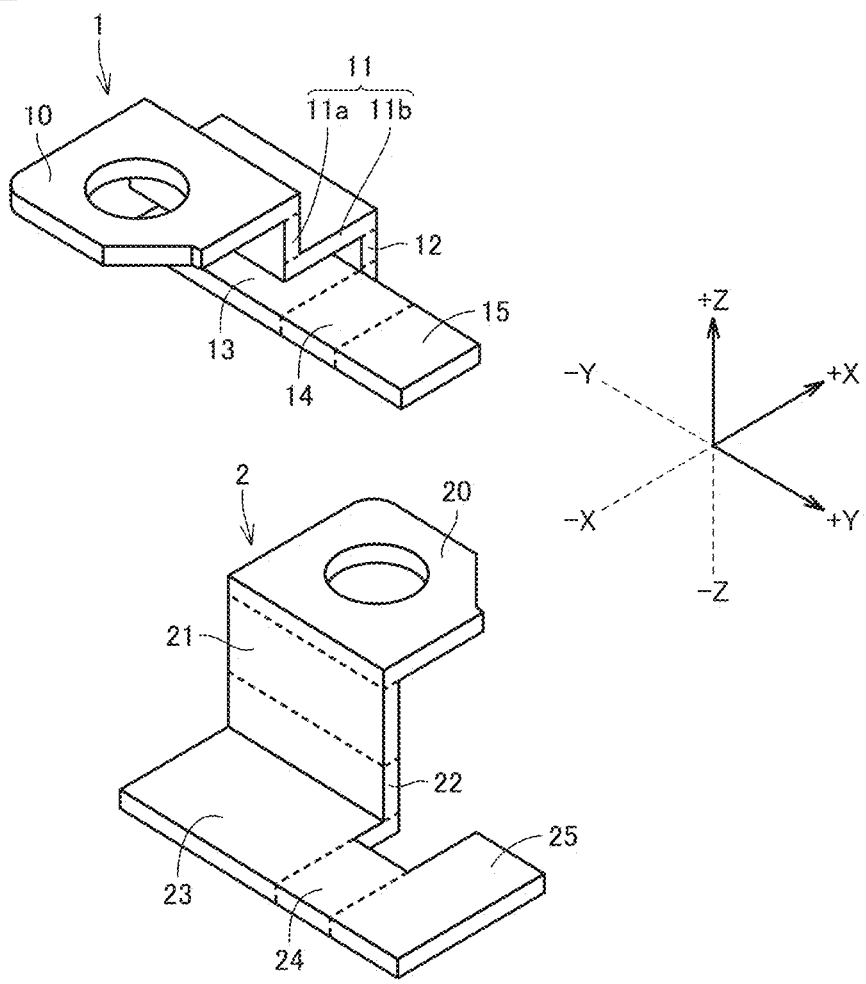
FIG. 2 is an exploded perspective view of a first power supply terminal and a second power supply terminal shown in FIG. 1.
Figure 3:
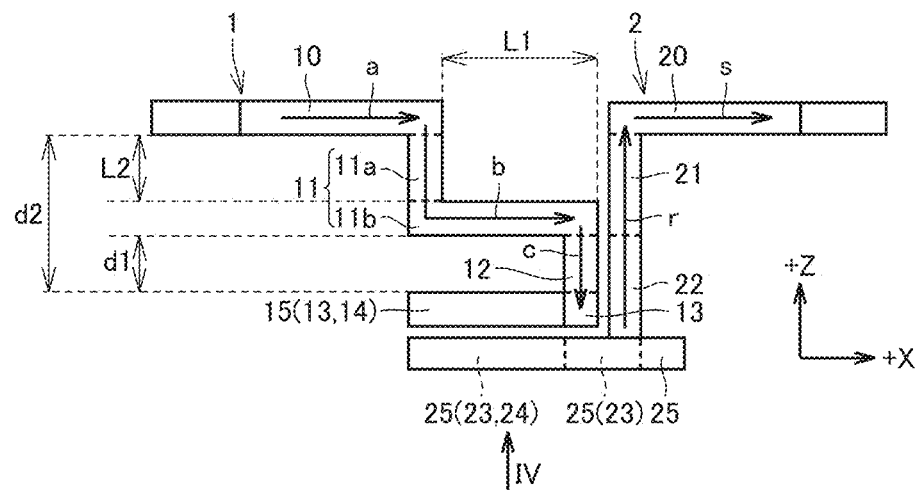
FIG. 3 is a side view of the first power supply terminal and the second power supply terminal shown in FIG. 1.
Figure 4:
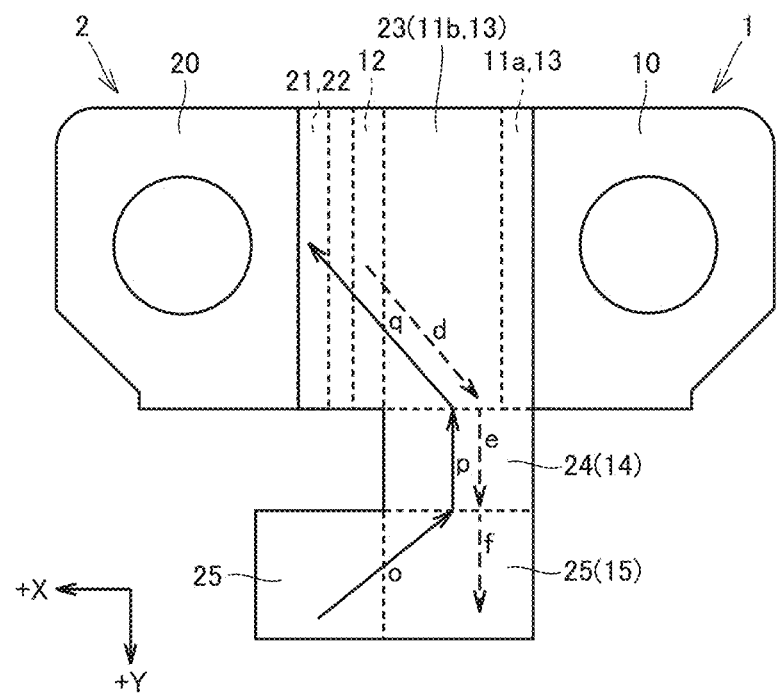
FIG. 4 is a bottom view of the first power supply terminal and the second power supply terminal shown in FIG. 1.
Figure 5:
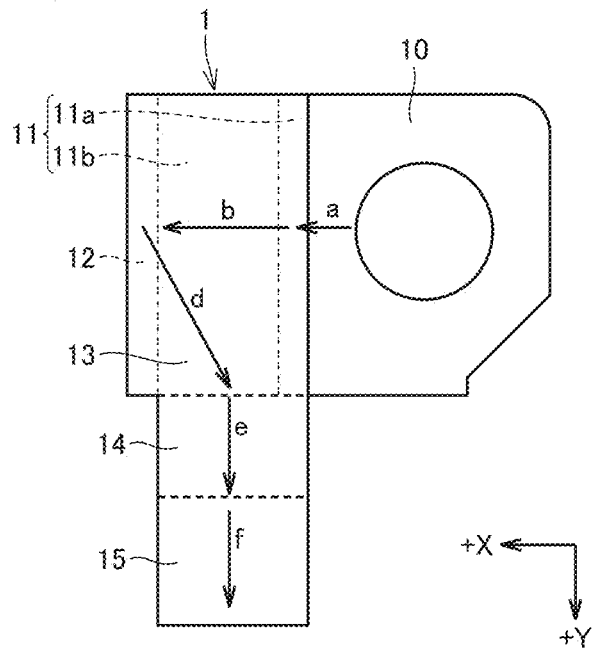
FIG. 5 is a bottom view of the first power supply terminal shown in FIG. 1.
Figure 6:
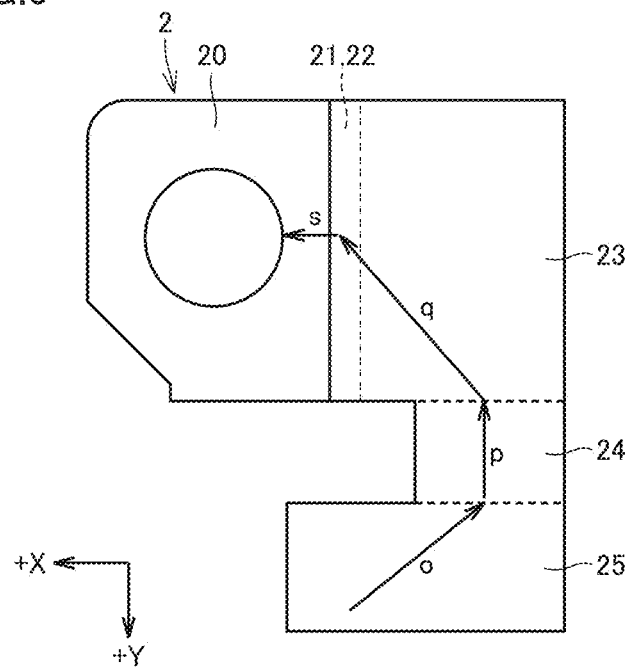
FIG. 6 is a bottom view of the second power supply terminal shown in FIG. 1.
Figure 7:
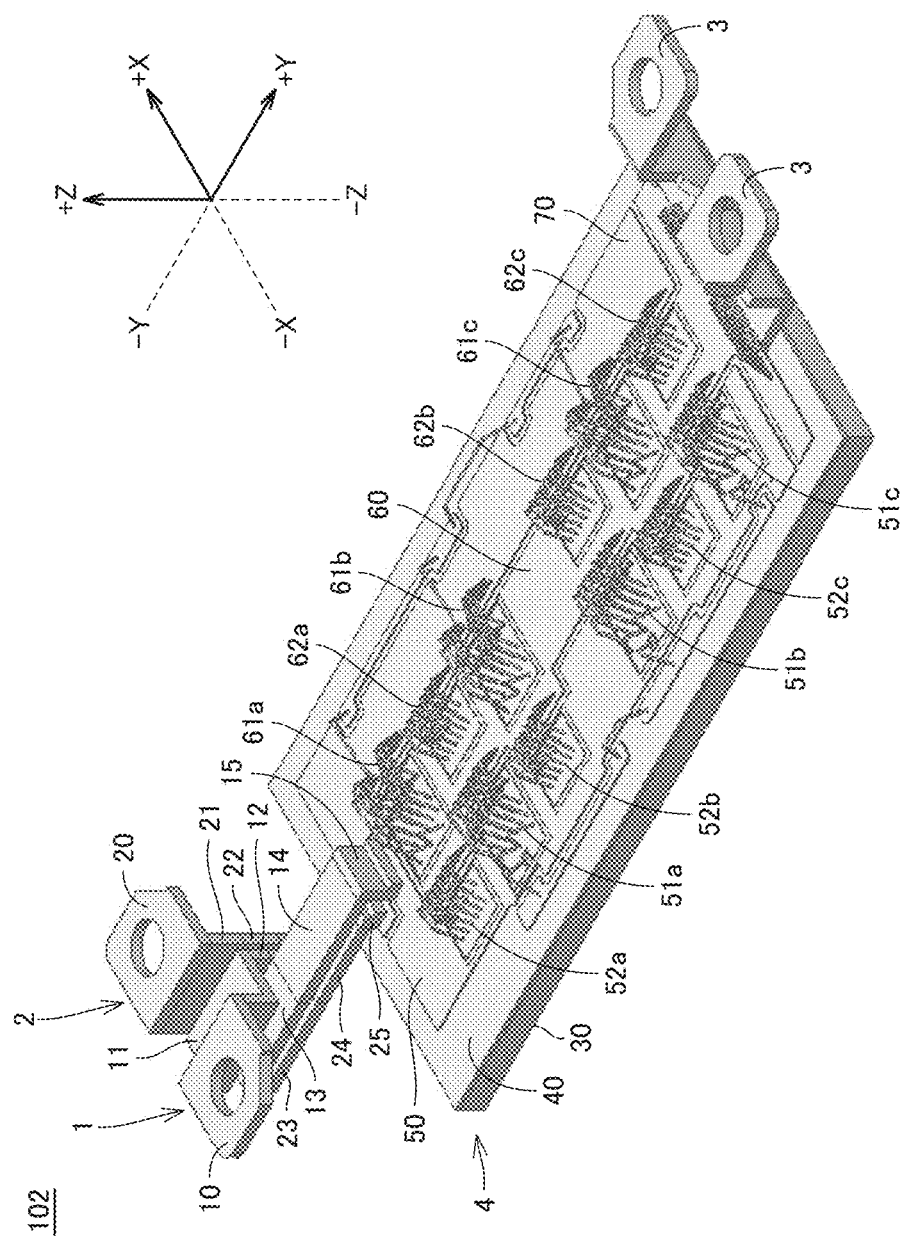
FIG. 7 is a perspective view of a semiconductor device according to a second embodiment.
Figure 8:
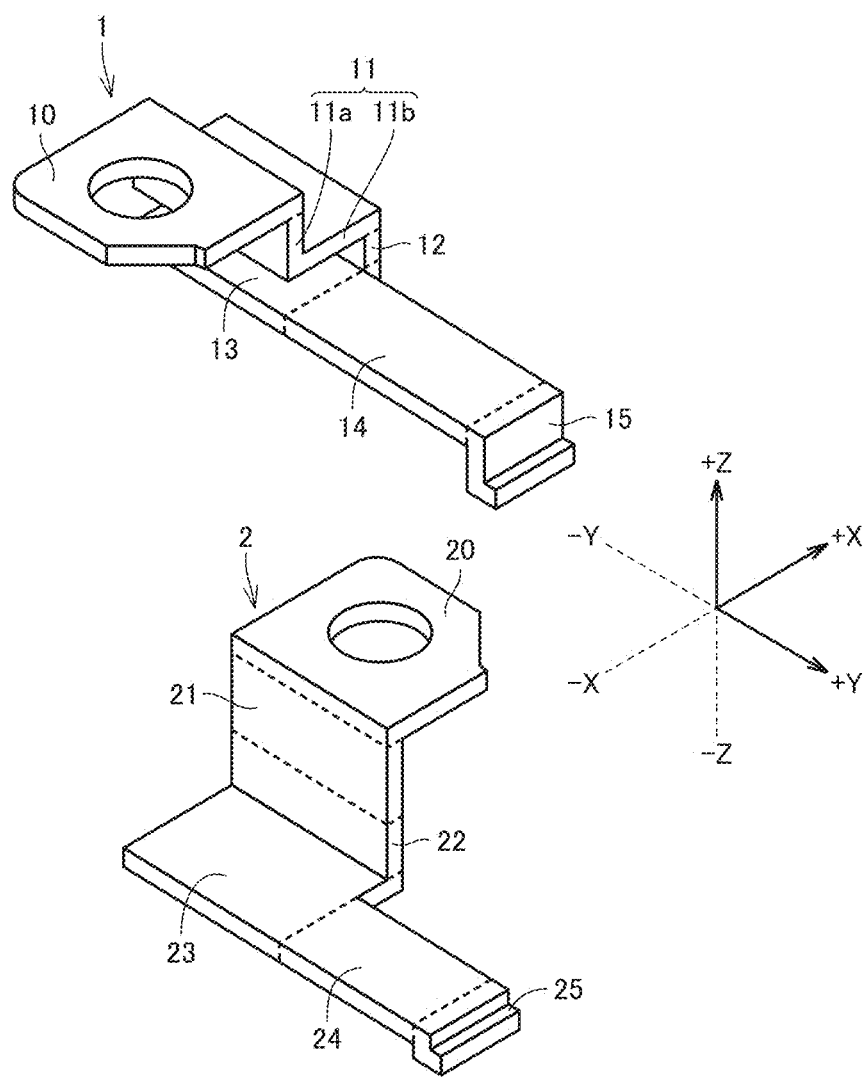
FIG. 8 is an exploded perspective view of a first power supply terminal and a second power supply terminal shown in FIG. 7.

The following describes the configuration and the arrangement of each of first power supply terminal 1 and second power supply terminal 2 with reference to FIGS. 2 to 6. As shown in FIGS. 2 to 4, first power supply terminal 1 further includes: a first facing portion 12 facing second power supply terminal 2 at a distance from second power supply terminal 2 in the X direction; second facing portions 13 and 14 facing second power supply terminal 2 at a distance from second power supply terminal 2 in the Z direction; and a third facing portion 11b facing second facing portions 13 and 14 at a distance from second facing portions 13 and 14 in the Z direction. Second facing portion 13 of first power supply terminal 1 is disposed between third facing portion 11b and second power supply terminal 2 in the Z direction. In first power supply terminal 1, second facing portions 13, 14 are connected to third facing portion 11b with first facing portion 12 interposed therebetween. First facing portion 12 and second facing portions 13, 14 are provided such that, upon application of a current, the current flows through first facing portion 12 and second facing portions 13, 14 in a direction opposite to a direction in which the current flows through each of portions in second power supply terminal 2 that face first facing portion 12 and second facing portions 13, 14. Second facing portion 13 and third facing portion 11b are provided such that, upon application of a current, the current flows through second facing portion 13 in a direction opposite to a direction in which the current flows through third facing portion 11b.

As shown in FIGS. 2 to 5, first power supply terminal 1 includes a first external connection portion 10, first intermediate connection portions 11 to 14, and a first internal connection portion 15. First external connection portion 10 is connected to the outside of semiconductor device 101. First internal connection portion 15 is connected to first switching elements 51a to 51c through first conductor pattern 50. First intermediate connection portions 11 to 14 connect first external connection portion 10 and first internal connection portion 15. First intermediate connection portions 11 to 14 include a first portion 11, a second portion 12, a third portion 13, and a fourth portion 14. First portion 11, second portion 12, third portion 13, and fourth portion 14 are connected in series in this order.

First portion 11 is connected to first external connection portion 10 and extends in the X direction. Second portion 12 is connected to first portion 11 and extends in the Z direction. Third portion 13 is connected to second portion 12 and extends in the X direction. Fourth portion 14 is connected to third portion 13 and extends in the Y direction.

First portion 11 has, for example, a first upright portion 11a extending in the Z direction and a horizontally extending portion 11b extending in the X direction. A +Z directional side end as one end of first upright portion 11a in the Z direction is connected to a +X directional side end as one end of first external connection portion in the X direction. A −Z directional side end as the other end of first upright portion 11a in the Z direction is connected to a −X directional side end as one end of horizontally extending portion 11b in the X direction. A +X directional side end as the other end of horizontally extending portion 11b in the X direction is connected to a +Z directional side end as one end of second portion 12 in the Z direction. A −Z directional side end as the other end of second portion 12 in the Z direction is connected to a +X directional side end as one end of third portion 13 in the X direction. A −X directional side end as the other end of third portion 13 in the X direction is spaced apart in the Z direction from the −X directional side end as the one end of horizontally extending portion 11b of first portion 11 in the X direction. A −Y directional side end as one end of third portion 13 in the Y direction is spaced apart in the Z direction from a −Y directional side end as one end of horizontally extending portion 11b of first portion 11 in the Y direction. A +Y directional side end as the other end of third portion 13 in the Y direction is spaced apart in the Z direction from a +Y directional side end as the other end of horizontally extending portion 11b of first portion 11 in the Y direction, and is connected to a −Y directional side end as one end of fourth portion 14 in the Y direction. A +Y directional side end as the other end of fourth portion 14 in the Y direction is connected to a −Y directional side end as one end of first internal connection portion 15 in the Y direction. First internal connection portion 15 is connected to first conductor pattern 50 via a wire bond.

As shown in FIGS. 2 to 4 and 6, second power supply terminal 2 includes a second external connection portion 20, second intermediate connection portions 21 to 24, and a second internal connection portion 25. Second external connection portion is connected to the outside of semiconductor device 101. Second internal connection portion 25 is connected to second switching elements 61a to 61c through third conductor pattern 70. Second intermediate connection portions 21 to 24 connect second external connection portion 20 and second internal connection portion 25.

Second intermediate connection portions 21 to 24 include fifth portions 21 and 22, a sixth portion 23, and a seventh portion 24. Fifth portions 21 and 22 are connected to second external connection portion 20 and extend in the Z direction. Sixth portion 23 is connected to fifth portions 21 and 22 and extends in the X direction. Seventh portion 24 is connected to sixth portion 23 and extends in the Y direction.

Fifth portions 21 and 22 include a second upright portion 21 and a third upright portion 22 that extend, for example, in the Z direction. A +Z directional side end as one end of second upright portion 21 in the Z direction is connected to a −X directional side end as one end of second external connection portion 20 in the X direction. A −Z directional side end as the other end of second upright portion 21 in the Z direction is connected to a +Z directional side end as one end of third upright portion 22 in the Z direction. A −Z directional side end as the other end of third upright portion 22 in the Z direction is connected to a +X directional side end as one end of sixth portion 23 in the X direction. A −Y directional side end as one end of seventh portion 24 in the Y direction is connected to a part of a +Y directional side end as one end of sixth portion 23 in the Y direction. A +Y directional side end as the other end of seventh portion 24 in the Y direction is connected to a part of a −Y directional side end as one end of second internal connection portion 25 in the Y direction. Second internal connection portion 25 is connected to third conductor pattern 70 via a wire bond.

Each of first external connection portion 10, first portion 11, second portion 12, third portion 13, fourth portion 14, and first internal connection portion 15 of first power supply terminal 1 is formed in a flat plate shape. Each of second external connection portion 20, fifth portions 21 and 22, sixth portion 23, seventh portion 24, and second internal connection portion 25 of second power supply terminal 2 is formed in a flat plate shape. First power supply terminal 1 and second power supply terminal 2 each are formed, for example, by bending a flat plate that is cut out in a predetermined shape. First external connection portion 10, first portion 11, second portion 12, third portion 13, fourth portion 14, and first internal connection portion 15 of first power supply terminal 1 have the same thickness. Second external connection portion 20, fifth portions 21 and 22, sixth portion 23, seventh portion 24, and second internal connection portion 25 of second power supply terminal 2 have the same thickness.

As shown in FIGS. 1 and 3, second portion 12 of first power supply terminal 1 and third upright portion 22 of fifth portions 21, 22 of second power supply terminal 2 face each other at a distance from each other in the X direction. Second portion 12 and third upright portion 22 are disposed to overlap each other when viewed in the X direction. Second portion 12 is disposed more on the −X direction side than fifth portions 21 and 22.

As shown in FIGS. 1 and 3, third portion 13 of first power supply terminal 1 and sixth portion 23 of second power supply terminal 2 face each other at a distance from each other in the Z direction. Fourth portion 14 of first power supply terminal 1 and seventh portion 24 of second power supply terminal 2 face each other at a distance from each other in the Z direction. First internal connection portion 15 and a part of second internal connection portion 25 face each other at a distance from each other in the Z direction. Third portion 13 and sixth portion 23 are disposed to overlap each other when viewed in the Z direction. Fourth portion 14 and seventh portion 24 are disposed to overlap each other when viewed in the Z direction. First internal connection portion 15 and a part of second internal connection portion 25 are disposed to overlap each other when viewed in the Z direction. The heights of first external connection portion 10 and second external connection portion 20 with respect to base plate 4 are the same, for example. Third portion 13, fourth portion 14, and first internal connection portion 15 are disposed more on the +Z direction side than sixth portion 23, seventh portion 24, and second internal connection portion 25.

The first facing portion includes second portion 12. The second facing portion includes third portion 13, fourth portion 14, and the above-mentioned part of first internal connection portion 15.

First external connection portion 10, first portion 11, second portion 12, and third portion 13 have the same width in the Y direction. Horizontally extending portion 11b of first portion 11, third portion 13, fourth portion 14, and first internal connection portion 15 have the same width in the X direction. The width of horizontally extending portion 11b of first portion 11 in the X direction is greater than the width of first upright portion 11a in the Z direction. The sum of the lengths in the X direction of the portions of first power supply terminal 1 that extend in the X direction is longer than the sum of the lengths in the Z direction of the portions of first power supply terminal 1 that extend in the Z direction. The sum of the lengths of first portion 11 and third portion 13 in the X direction is longer than the sum of the lengths of first portion 11 and second portion 12 in the Z direction.

Second external connection portion 20, fifth portions 21 and 22, and sixth portion 23 have the same width in the Y direction. The width of each of sixth portion 23 and second internal connection portion 25 in the X direction is greater than the width of seventh portion 24 in the X direction.

The width of each of second external connection portion 20, fifth portions 21, 22, and sixth portion 23 in the Y direction is equal, for example, to the width of each of first external connection portion 10, first portion 11, second portion 12, and third portion 13 in the Y direction. The width of sixth portion 23 in the X direction is greater than the width of each of horizontally extending portion 11b of first portion 11, third portion 13, fourth portion 14, and first internal connection portion 15 in the X direction. The width of seventh portion 24 in the X direction is greater than the width of fourth portion 14 in the X direction, for example.

The distance between second portion 12 and fifth portion 22 in the X direction, the distance between third portion 13 and sixth portion 23 in the Z direction, the distance between fourth portion 14 and seventh portion 24 in the Z direction, and the distance between first internal connection portion 15 and second internal connection portion 25 in the Z direction am the same, for example.

The width of horizontally extending portion 11b of first portion 11 in the X direction is greater than the width of second upright portion 21 of fifth portions 21 and 22 in the Z direction.

As shown in FIG. 3, a distance d1 between horizontally extending portion 11b of first portion 11 of first power supply terminal 1 and third portion 13 in the Z direction is shorter than a distance d2 between first external connection portion 10 and first internal connection portion 15 in the Z direction. Distance d1 is equal to or less than half of distance d2, for example. Distance d1 is shorter, for example, than each of the distance between second portion 12 and fifth portion 22 in the X direction, the distance between third portion 13 and sixth portion 23 in the Z direction, the distance between fourth portion 14 and seventh portion 24 in the Z direction, and the distance between first internal connection portion 15 and second internal connection portion 25 in the Z direction.

When a current is applied to flow through semiconductor device 101 in the state where first power supply terminal 1 is connected to a positive electrode of the external power supply and second power supply terminal 2 is connected to a negative electrode of the external power supply, current paths indicated by arrows in FIGS. 3 to 6 are formed in first power supply terminal 1 and second power supply terminal 2.

In first power supply terminal 1, a current path is formed through which a current flows in the order of first external connection portion 10, first portion 11, second portion 12, third portion 13, fourth portion 14, and first internal connection portion 15. In second power supply terminal 2, a current path is formed through which a current flows in the order of second internal connection portion 25, seventh portion 24, sixth portion 23, third upright portion 22, second upright portion 21, and second external connection portion 20.

The current path in first power supply terminal 1 connects first external connection portion 10 and first internal connection portion 15 of first power supply terminal 1 at the shortest distance with the intermediate connection portion interposed therebetween. A current path "a" extends through first external connection portion 10. A current path "b" extends through first portion 11. A current path "c" extends through second portion 12. A current path "d" extends through third portion 13. A current path "d" is a path through which a current flows toward the −X direction side and the +Y direction side with respect to second portion 12. A current path "e" extends through fourth portion 14 and first internal connection portion 15. The sum of the lengths in the X direction of current paths "a" to "e" formed in first power supply terminal 1 is longer than the sum of the lengths in the Z direction of current paths "a" to "e".

The above-mentioned current path in second power supply terminal 2 connects second external connection portion 20 and second internal connection portion 25 of second power supply terminal 2 at the shortest distance with the above-mentioned intermediate connection portion interposed therebetween. A current path "o" extends through second internal connection portion 25. A current path "p" extends through seventh portion 24. A current path "q" extends through sixth portion 23. A current path "r" extends through third upright portion 22 and second upright portion 21. A current path "s" extends through second external connection portion 20.

As shown in FIGS. 3 and 4, current path "c" formed in second portion 12 of first power supply terminal 1 extends in parallel to current path "r" formed in fifth portion 22 of second power supply terminal 2 and is opposite in current flowing direction to current path "r". Current path "d" formed in third portion 13 of first power supply terminal 1 extends in parallel to current path "q" formed in sixth portion 23 of second power supply terminal 2 and is opposite in current flowing direction to current path "q". Current path "e" formed in fourth portion 14 of first power supply terminal 1 extends in parallel to current path "p" formed in seventh portion 24 of second power supply terminal 2 and is opposite in current flowing direction to current path "p". Current path "f" formed in first internal connection portion 15 of first power supply terminal 1 is opposite in current flowing direction to the Y-direction component of current path "o" formed in second internal connection portion 25 of second power supply terminal 2. In other words, the currents flowing through the first facing portions of first power supply terminal 1 and second power supply terminal 2 flow in opposite directions, and the currents flowing through the second facing portions of first power supply terminal 1 and second power supply terminal 2 flow in opposite directions.

As shown in FIGS. 3 and 4, in first power supply terminal 1, current path "b" formed in horizontally extending portion 11b of first portion 11 is opposite in current flowing direction to the X-direction component of current path "d" formed in third portion 13 of first power supply terminal 1.

<Functions and Effects>

As described above, each of the conventional semiconductor devices includes a positive electrode side terminal and a negative electrode side terminal that only face each other, and a part of the positive electrode side terminal or the negative electrode side terminal is not disposed to face another portion.

On the other hand, in semiconductor device 101, first power supply terminal 1 and second power supply terminal 2 each have the first facing portion and the second facing portion, and also, first power supply terminal 1 still has horizontally extending portion 11b of the first portion and third portion 13 that face each other in the Z direction. Thus, in semiconductor device 101, the mutual inductance generated between first power supply terminal 1 and second power supply terminal 2 in each of the first facing portion and the second facing portion acts to reduce the parasitic inductance in each of first power supply terminal 1 and second power supply terminal 2, and also, the mutual inductance generated in the third facing portion between first portion 11 and third portion 13 of first power supply terminal 1 acts to reduce the parasitic inductance in first power supply terminal 1. In other words, in semiconductor device 101, not only the parasitic inductance in each of first internal connection portion 15, third portion 13, and fourth portion 14 in first power supply terminal 1 and fifth portion 22, sixth portion 23, and seventh portion 24 in second power supply terminal 2 is reduced, but also the parasitic inductance in first portion 11 in first power supply terminal 1 is reduced.

Specifically, according to semiconductor device 101, the inductances in first power supply terminal 1 and second power supply terminal 2 are reduced as compared with the above-mentioned conventional semiconductor devices. Thus, even when semiconductor device 101 includes first switching elements 51a to 51c and second switching elements 61a to 61c that are further increased in switching speed as compared with currently available switching elements, an increase in surge voltage can be suppressed as compared with the above-mentioned conventional semiconductor devices. Consequently, according to semiconductor device 101, the reliability is improved as compared with the conventional semiconductor devices.

In semiconductor device 101, horizontally extending portion 11b of the first portion is connected to first external connection portion 10 with first upright portion 11a interposed therebetween. Accordingly, the distance between horizontally extending portion 11b and third portion 13 in the Z direction is shorter than the distance between first external connection portion 10 and third portion 13 in the Z direction. Thus, the inductance in first power supply terminal 1 of semiconductor device 101 is reduced as compared with the inductance in first power supply terminal 1 having a configuration in which first external connection portion 10 is connected to second portion 12 extended in the Z direction without first portion 11 interposed therebetween and also first external connection portion 10 and third portion 13 face each other at distance d2 from each other.

In semiconductor device 101, a length L1 of horizontally extending portion 11b of the first portion in the X direction is longer than a length L2 of first upright portion 11a in the Z direction. Thus, the inductance in first power supply terminal 1 of semiconductor device 101 is reduced as compared with the inductance in first power supply terminal 1 having a configuration in which second portion 12 extended by length L2 in the Z direction faces fifth portions 21 and 22.

Further, in semiconductor device 101, the second facing portion has third portion 13 contiguous in the X direction to second portion 12 as the first facing portion. In other words, third portion 13 extending in the X direction with respect to second portion 12 forms a part of the second facing portion. The following describes a configuration conceivable as a comparative example, in which third portion 13 of first power supply terminal 1 extends in the −X direction with respect to second portion 12, and sixth portion 23 of second power supply terminal 2 extends in the +X direction with respect to fifth portion 22. The comparative example is the same as semiconductor device 101 in that second portion 12 and fifth portion 22 face each other at a distance from each other in the X direction, but is different from semiconductor device 101 in that third portion 13 and sixth portion 23 do not face each other at a distance from each other in the Z direction, and only fourth portion 14 forms the second facing portion. By simulation evaluation or the like, the present inventors have found that the parasitic inductance in the internal wiring of semiconductor device 101 is smaller than the parasitic inductance in the internal wiring in the above-mentioned comparative example, and third portion 13 forms a part of the second facing portion, which consequently greatly contributes to a reduction in the above-mentioned parasitic inductance.

Second Embodiment

As shown in FIGS. 7 to 13, a semiconductor device 102 according to the second embodiment is basically similar in configuration to semiconductor device 101 according to the first embodiment, but is different from semiconductor device 101 in that first power supply terminal 1 further includes a fourth facing portion that faces second power supply terminal 2 at a distance from second power supply terminal 2 in the Y direction.

First power supply terminal 1 and second power supply terminal 2 of semiconductor device 102 are basically similar in configuration to first power supply terminal 1 and second power supply terminal 2, respectively, of semiconductor device 101, but are different from first power supply terminal 1 and second power supply terminal 2, respectively, of semiconductor device 101 in that first internal connection portion 15 and second internal connection portion 25 face each other at a distance from each other in the Y direction.

Fourth portion 14 is longer in Y direction than seventh portion 24. A +Y directional side end as the other end of fourth portion 14 in the Y direction is disposed closer to output terminal 3 in the Y direction than the +Y directional side end as the other end of seventh portion 24 in the Y direction.

First internal connection portion 15 is disposed closer to output terminal 3 in the Y direction than second internal connection portion 25. First internal connection portion 15 has one end in the Z direction that is connected to the +Y directional side end of fourth portion 14 and the other end in the Z direction that is connected to first conductor pattern 50. Second internal connection portion 25 has one end in the Z direction that is connected to the +Y directional side end of seventh portion 24 and the other end in the Z direction that is connected to third conductor pattern 70.

First internal connection portion 15 is connected to first conductor pattern 50, for example, via solder. Second internal connection portion 25 is connected to third conductor pattern 70, for example, via solder.

When a current is applied to flow through semiconductor device 102 in the state where first power supply terminal 1 is connected to a positive electrode of the external power supply and second power supply terminal 2 is connected to a negative electrode of the external power supply, current paths indicated by arrows in FIGS. 9 to 13 are formed in first power supply terminal 1 and second power supply terminal 2.

The current paths formed in first power supply terminal 1 and second power supply terminal 2 in semiconductor device 102 are different from those in semiconductor device 101 in that they include a current path "f" through which a current flows through first internal connection portion 15 in the −Z direction and a current path "o" through which a current flows through second internal connection portion 25 in the +Z direction.

Figure 9:
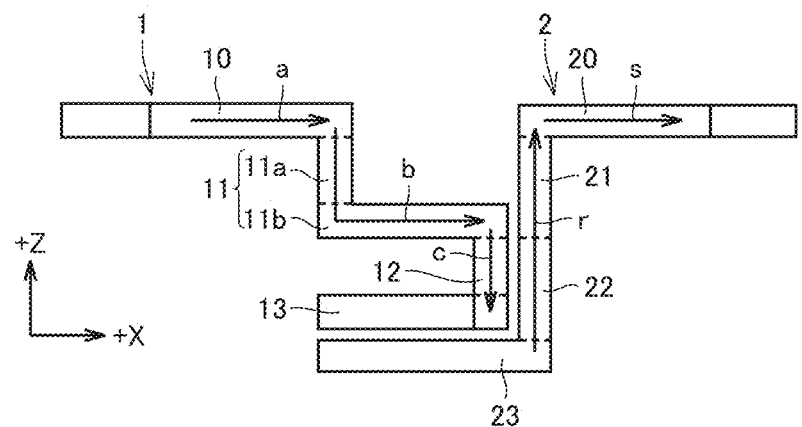
FIG. 9 is a side view of the first power supply terminal and the second power supply terminal shown in FIG. 7.
Figure 10:
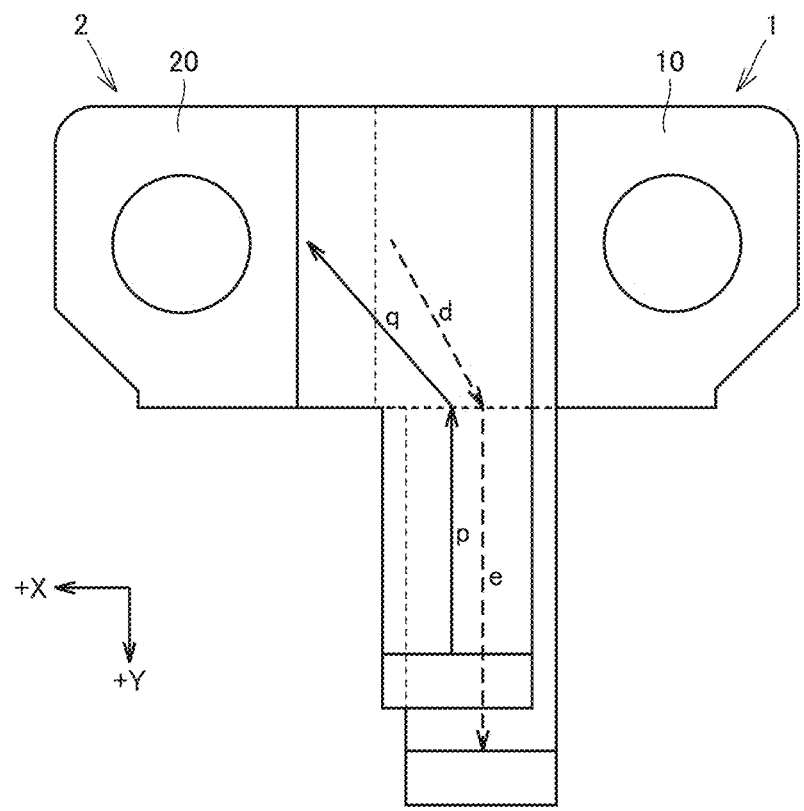
FIG. 10 is a bottom view of the first power supply terminal and the second power supply terminal shown in FIG. 7.
Figure 11:
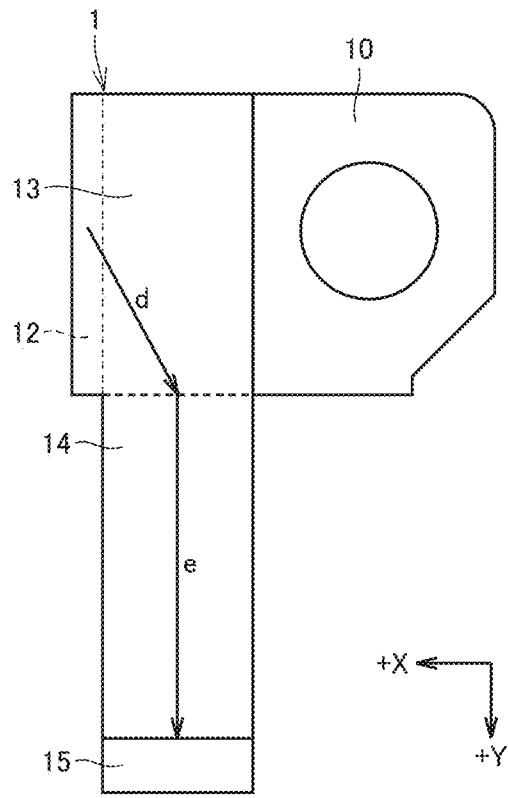
FIG. 11 is a bottom view of the first power supply terminal shown in FIG. 7.
Figure 12:
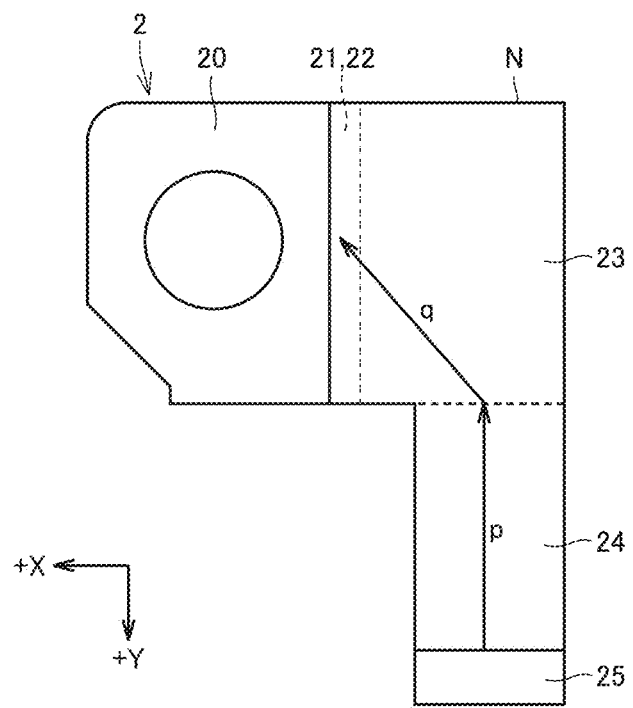
FIG. 12 is a bottom view of the second power supply terminal shown in FIG. 7.
Figure 13:
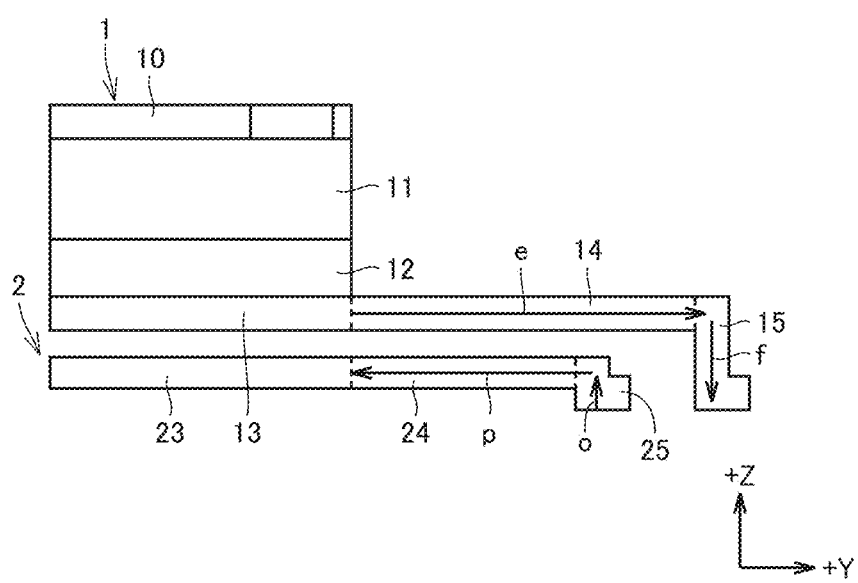
FIG. 13 is a side view of the first power supply terminal and the second power supply terminal shown in FIG. 7.
Figure 14:
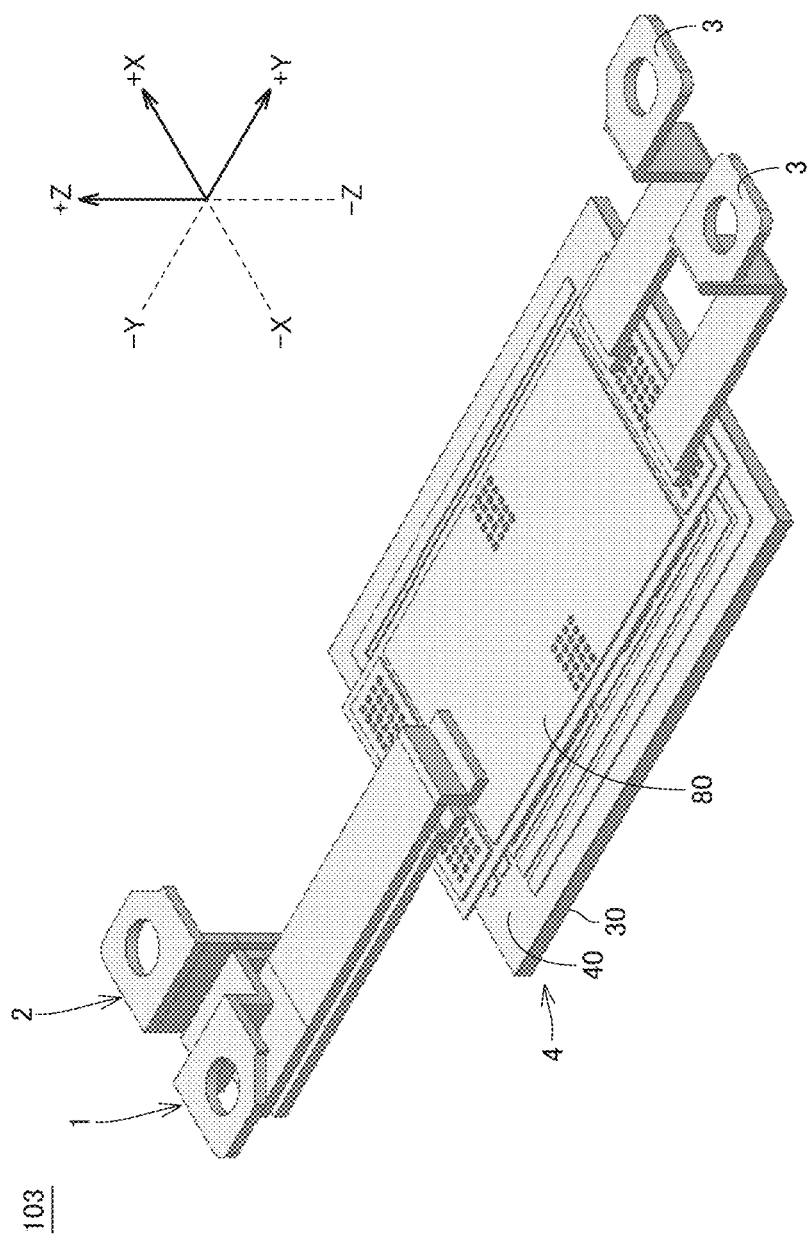
FIG. 14 is a perspective view of a semiconductor device according to a third embodiment.

As shown in FIGS. 9 and 10, current path "c" formed in second portion 12 of first power supply terminal 1 is disposed in parallel to current path "r" formed in fifth portion 22 of second power supply terminal 2 and is opposite in current flowing direction to current path "r". Current path "d" formed in third portion 13 of first power supply terminal 1 is disposed in parallel to current path "q" formed in sixth portion 23 of second power supply terminal 2 and is opposite in current flowing direction to current path "q". Current path "e" formed in fourth portion 14 of first power supply terminal 1 is disposed in parallel to current path "p" formed in seventh portion 24 of second power supply terminal 2 and is opposite in current flowing direction to current path "p". Current path "f" formed in first internal connection portion 15 of first power supply terminal 1 is disposed in parallel to current path "o" formed in second internal connection portion 25 of second power supply terminal 2 and is opposite in current flowing direction to current path "o". In other words, the currents flowing through the first facing portions of first power supply terminal 1 and second power supply terminal 2 flow in opposite directions, and the currents flowing through the second facing portions of first power supply terminal 1 and second power supply terminal 2 flow in opposite directions.

As shown in FIGS. 9 and 10, in first power supply terminal 1, current path "b" formed in horizontally extending portion 11b of first portion 11 is opposite in current flowing direction to the X-direction component of current path "d" formed in third portion 13 of first power supply terminal 1.

Since semiconductor device 102 is basically similar in configuration to semiconductor device 101, the effect similar to that achieved by semiconductor device 101 can be achieved. Further, in semiconductor device 102, first internal connection portion 15 and second internal connection portion 25 are disposed to face each other in the Y direction, and thereby, the inductances in first power supply terminal 1 and second power supply terminal 2 are reduced as compared with semiconductor device 101.

Third Embodiment

As shown in FIGS. 14 to 21, semiconductor device 103 according to the third embodiment is basically similar in configuration to semiconductor device 102 according to the second embodiment, but is different from semiconductor device 102 in that a first conductor 50a connecting first power supply terminal 1 and first switching elements 51a to 51c and a second conductor 70b connecting second power supply terminal 2 and second switching elements 61a to 61c face each other at a distance from each other.

Figure 15:
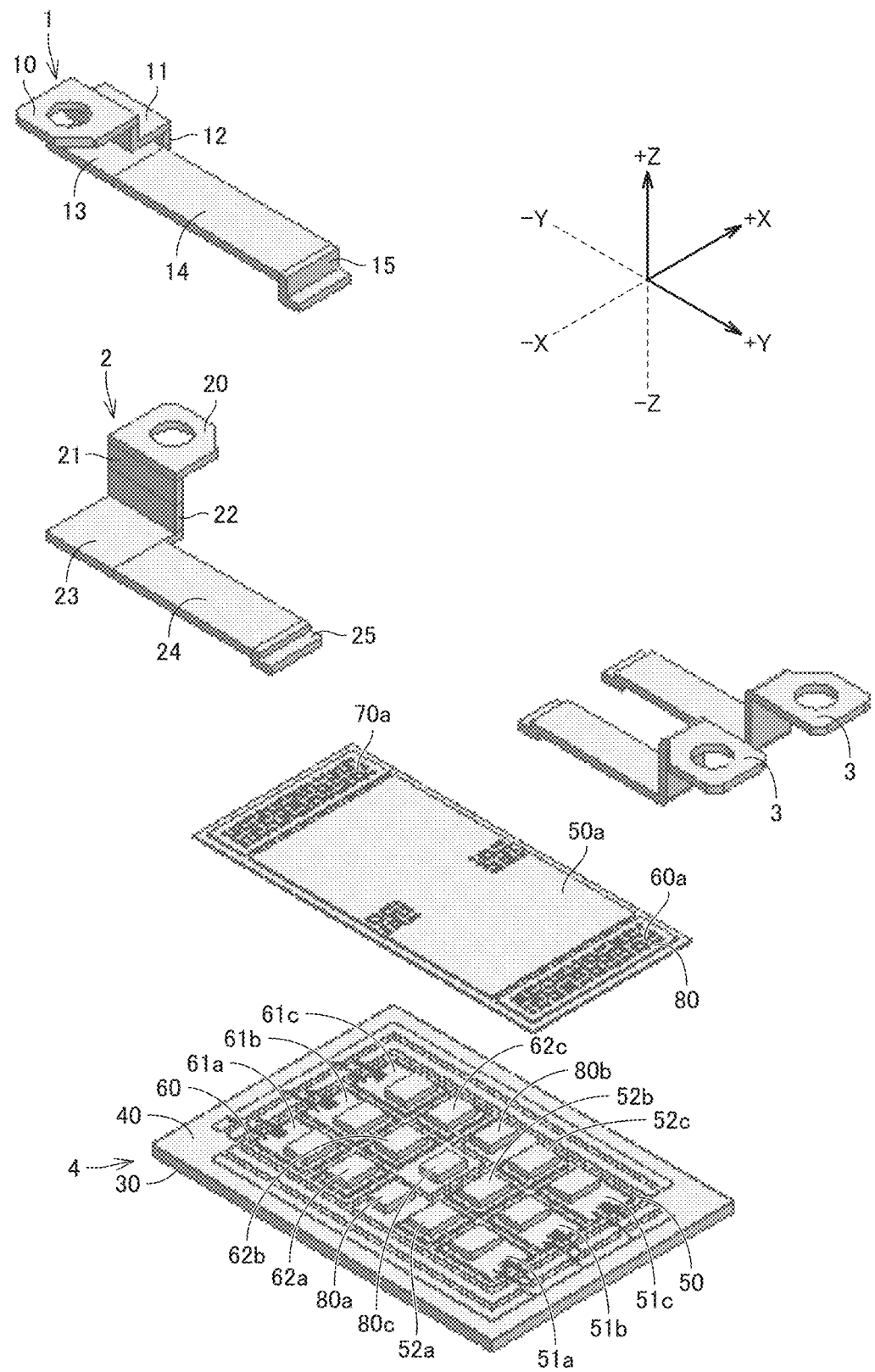
FIG. 15 is an exploded perspective view of a first power supply terminal and a second power supply terminal shown in FIG. 14.

As shown in FIG. 15, base plate 4 of semiconductor device 103 is basically similar in configuration to base plate 4 of semiconductor device 101, but is different from base plate 4 of semiconductor device 101 in that it further includes a first pad 80a, a second pad 80b, and a third pad 80c that are disposed on insulating layer 40. First pad 80a and second pad 80b are connected to first conductor pattern 50. Third pad 80c is connected to second conductor pattern 60.

The plurality of first switching elements 51a to 51c are arranged side by side in the X direction, for example. The plurality of first diode elements 52a to 52c are arranged side by side in the X direction, for example. The plurality of second switching elements 61a to 61c are arranged side by side in the X direction, for example. The plurality of second diode elements 62a to 62c are arranged side by side in the X direction, for example. First pad 80a and second pad 80b are arranged to sandwich third pad 80c therebetween in the X direction, for example. The plurality of first switching elements 51a to 51c, the plurality of first diode elements 52a to 52c, the plurality of second switching elements 61a to 61c, and the plurality of second diode elements 62a to 62c are disposed such that first pad 80a, second pad 80b, and third pad 80c are respectively sandwiched between: first switching elements 51a, 51b, 51c, and first diode elements 52a, 52b, 52c; and second switching elements 61a, 61b, 61c, and second diode elements 62a, 62b, 62c, for example, in the Y direction.

Semiconductor device 103 further includes a printed circuit board 80 stacked on base plate 4 in the Z direction. First conductor 50S and second conductor 70b are formed on one surface and the other surface, respectively, of printed circuit board 80. Printed circuit board 80 includes: first conductor 50a, a third conductor 60a, and a fourth conductor 70a that are formed on one surface; and second conductor 70b, a fifth conductor 50b, a sixth conductor 50c, and a seventh conductor 60b that are formed on the other surface. First conductor 50sa, third conductor 60a, and fourth conductor 70a are disposed at a distance from each other. Second conductor 70b, fifth conductor 50b, sixth conductor 50c, and seventh conductor 60b are disposed at a distance from each other.

Printed circuit board 80 is disposed such that the other surface faces base plate 4 in the Z direction. In other words, the above-mentioned one surface of printed circuit board 80 faces in the +Z direction, and the above-mentioned other surface of printed circuit board 80 faces in the −Z direction. In printed circuit board 80, first conductor 50a and second conductor 70b face each other at a distance from each other in the Z direction.

Fifth conductor 50b and sixth conductor 50c are electrically connected to first conductor 50a through a plurality of conductive members 50d and 50e formed inside printed circuit board 80. Seventh conductor 60b is electrically connected to third conductor 60a through a plurality of conductive members 60c formed inside printed circuit board 80. Second conductor 70b is electrically connected to fourth conductor 70a through a plurality of conductive members 70c formed inside printed circuit board 80. Printed circuit board 80 is provided with a plurality of through holes penetrating from one surface to the other surface, and each conductive member is disposed inside each through hole. Each of the conductive members is formed as a plating film, for example. Conductive members 50d and 50e connecting first conductor 50a to fifth conductor 50b and sixth conductor 50c, respectively, are disposed in the Y direction between: conductive member 60c connecting third conductor 60a and seventh conductor 60b; and conductive member 70c connecting fourth conductor 70a and second conductor 70b. Conductive member 50d connecting first conductor 50a and fifth conductor 50b is spaced apart in the X direction from conductive member 50e connecting first conductor 50a and sixth conductor 50c.

First conductor 50a is connected to first internal connection portion 15 of first power supply terminal 1, for example, via solder. A portion of first conductor 50a that is connected to first internal connection portion 15 is disposed closer to fourth conductor 70a than conductive members 50d and 50e. Third conductor 60a is connected to output terminal 3, for example, via solder. Fourth conductor 70a is connected to second internal connection portion 25 of second power supply terminal 2, for example, via solder.

Second conductor 70b is connected, for example, via solder to each of the sources of the plurality of second switching elements 61a and each of the anodes of the plurality of first diode elements 52a to 52c. Each of the portions in second conductor 70b that are connected to the sources of the plurality of second switching elements 61a and connected to the anodes of the plurality of first diode elements 52a to 52c is disposed closer to fifth conductor 50b and sixth conductor 50c than conductive member 70c. Fifth conductor 50b is connected to first pad 80a, for example, via solder. Sixth conductor 50c is connected to second pad 80b, for example, via solder. Seventh conductor 60b is connected, for example, via solder to each of the sources of the plurality of first switching elements 51a to 51c and each of the anodes of the plurality of first diode elements 52a to 52c.

In other words, the drains of the plurality of first switching elements 51a to 51c and the cathodes of the plurality of first diode elements 52a to 52c are connected to first power supply terminal 1 through first conductor pattern 50, first pad 80a, second pad 80b, fifth conductor 50b, sixth conductor 50c, and first conductor 50a. The sources of the plurality of first switching elements 51a to 51c and the anodes of the plurality of first diode elements 52a to 52c are connected to output terminal 3 through seventh conductor 60b and third conductor 60a.

The drains of the plurality of second switching elements 61a to 61c and the cathodes of the plurality of second diode elements 62a to 62c are connected to output terminal 3 through second conductor pattern 60, third pad 80c, and seventh conductor 60b and third conductor 60a of printed circuit board 80. The sources of the plurality of second switching elements 61a to 61c and the anodes of the plurality of second diode elements 62a to 62c are connected to second power supply terminal 2 through second conductor 70b and fourth conductor 70a.

Figure 16:
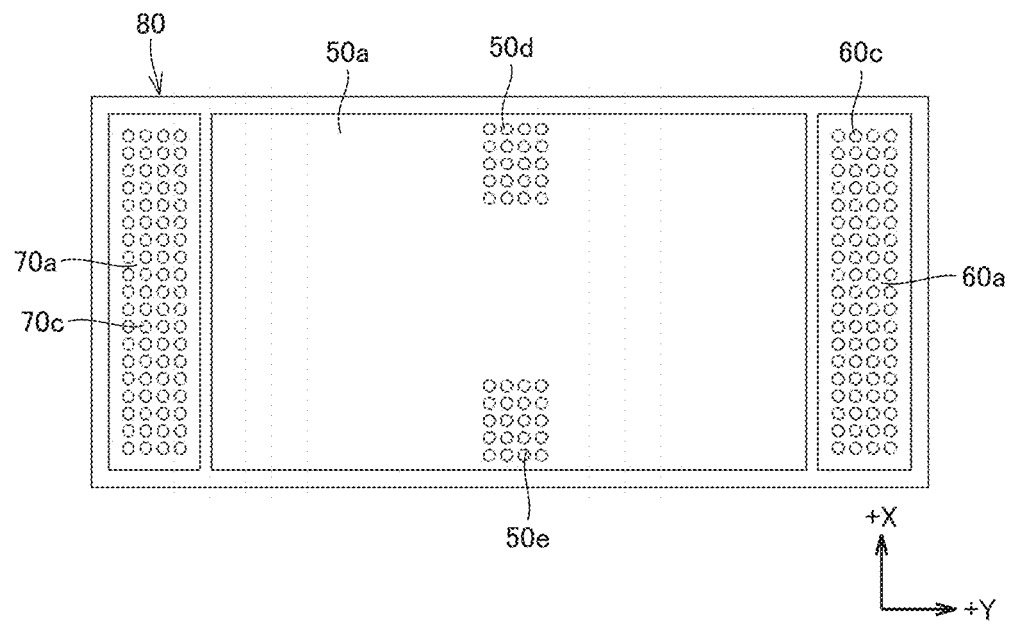
FIG. 16 is a plan view of a printed circuit board shown in FIG. 14.

As shown in FIG. 16, in printed circuit board 80, first conductor 50a, third conductor 60a, and fourth conductor 70a are disposed at a distance from each other. First conductor 50a extends in the Y direction. Third conductor 60a and fourth conductor 70a are disposed to sandwich first conductor 50a therebetween in the Y direction.

Figure 17:
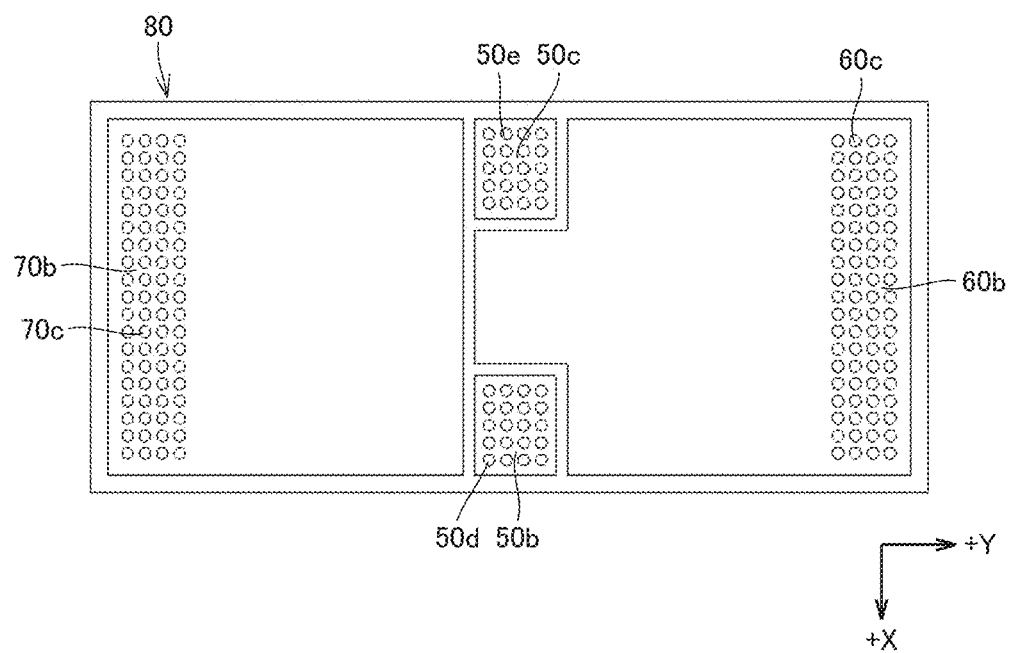
FIG. 17 is a bottom view of the printed circuit board shown in FIG. 14.

As shown in FIG. 17, in printed circuit board 80, second conductor 70b, fifth conductor 50b, sixth conductor 50c, and seventh conductor 60b are disposed at a distance from each other. Fifth conductor 50b and sixth conductor 50c are disposed to sandwich seventh conductor 60b therebetween in the X direction.

When a current is applied to flow through semiconductor device 103 in the state where first power supply terminal 1 is connected to a positive electrode of the external power supply and second power supply terminal 2 is connected to a negative electrode of the external power supply, current paths indicated by arrows in FIGS. 18 to 21 are formed in first power supply terminal 1 and second power supply terminal 2.

Figure 18:
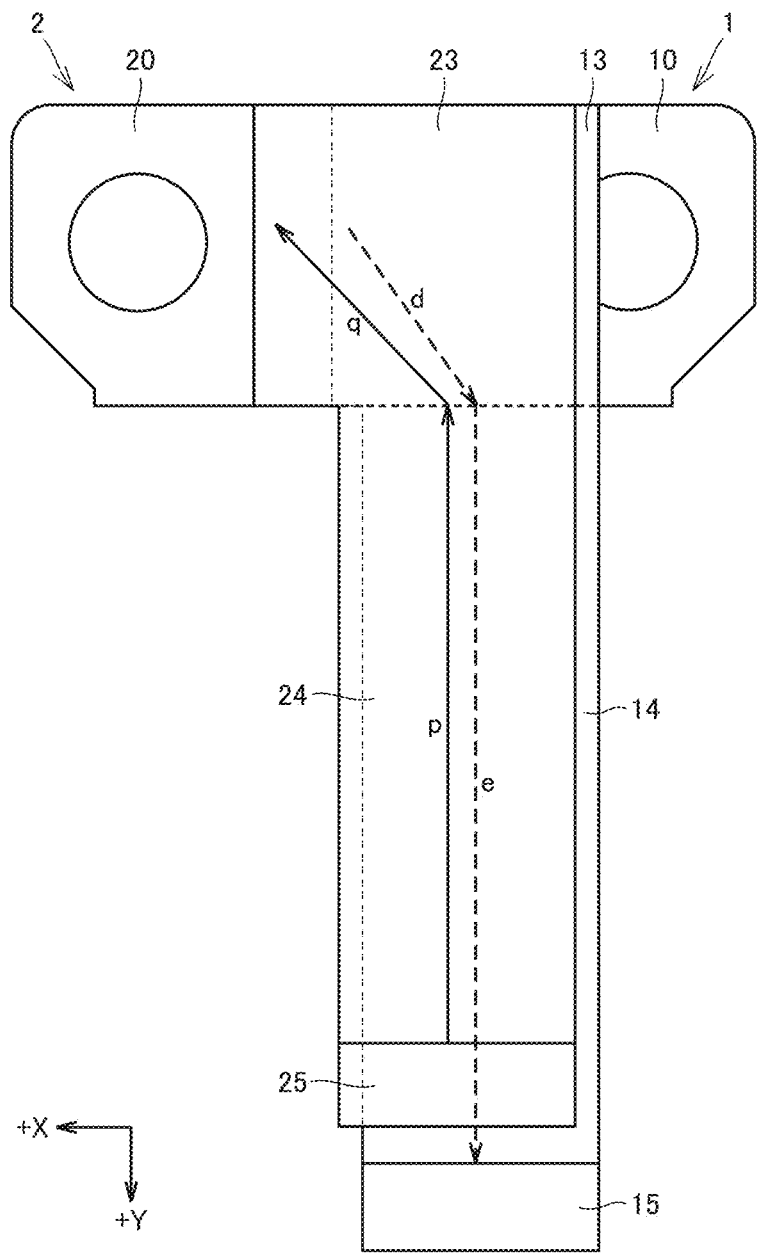
FIG. 18 is a bottom view of the first power supply terminal and the second power supply terminal shown in FIG. 14.
Figure 19:
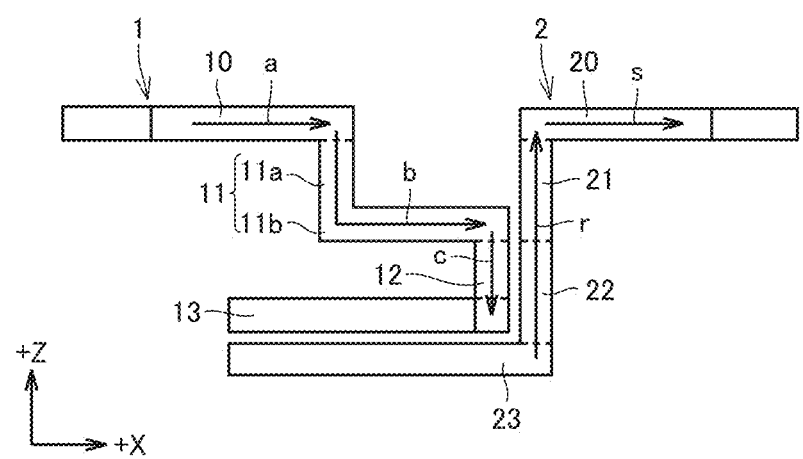
FIG. 19 is a side view of the first power supply terminal and the second power supply terminal shown in FIG. 14.
Figure 20:
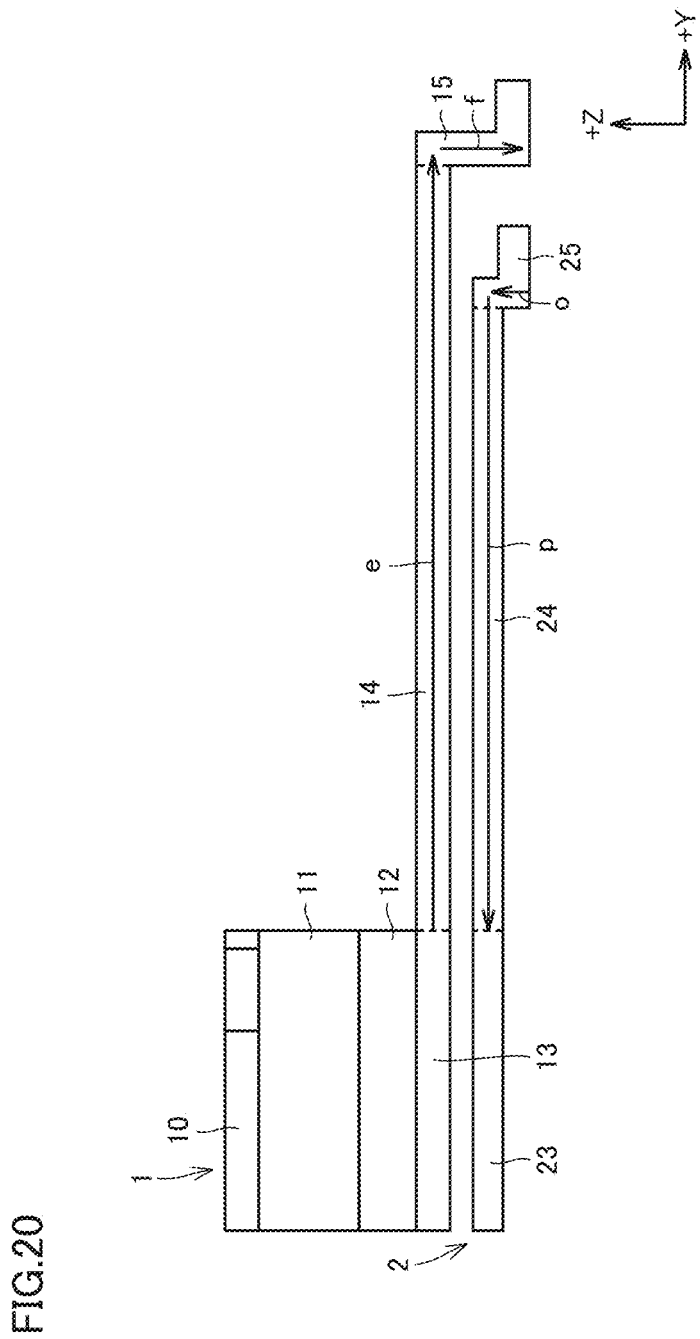
FIG. 20 is a side view of the first power supply terminal and the second power supply terminal shown in FIG. 14.

As shown in FIGS. 18 to 20, the current paths formed in first power supply terminal 1 and second power supply terminal 2 of semiconductor device 103 are equivalent to the current paths formed in first power supply terminal 1 and second power supply terminal 2 of semiconductor device 102 shown in FIGS. 9 to 13.

Figure 21:
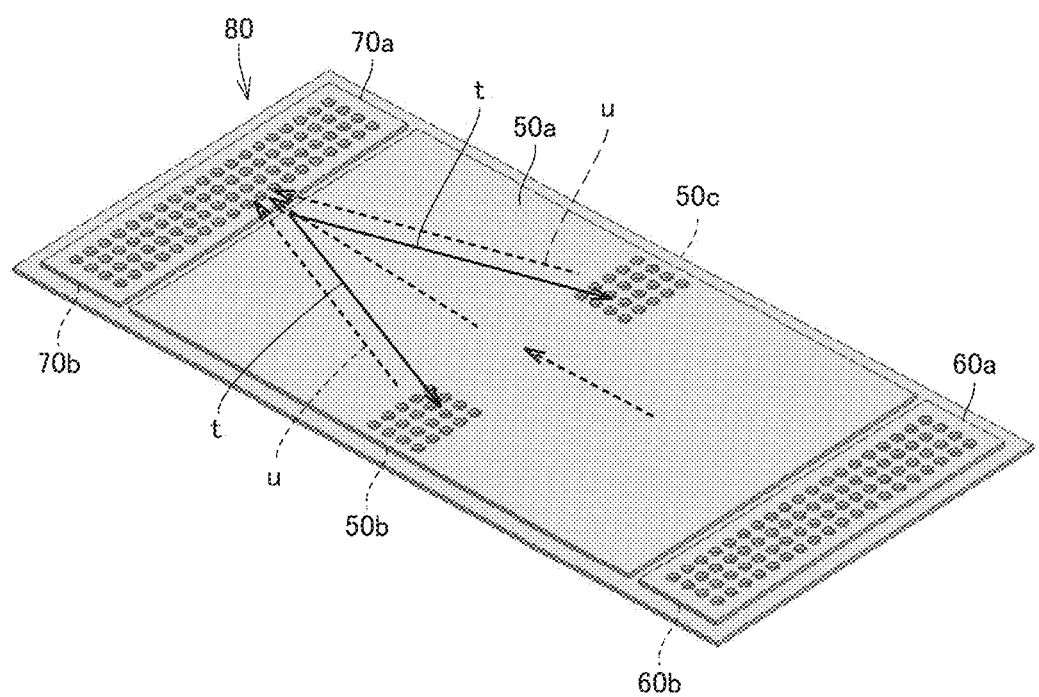
FIG. 21 is a perspective view of the printed circuit board shown in FIG. 14.

As shown in FIG. 21, in semiconductor device 103, a current path "t" formed in first conductor 50a is disposed in parallel to a current path "u" formed in second conductor 70b and is opposite in current flowing direction to current path "u".

Since semiconductor device 103 is basically similar in configuration to semiconductor device 102, the effects similar to those achieved by semiconductor devices 101 and 102 can be achieved. Further, in semiconductor device 103, first conductor 50a disposed between first power supply terminal 1 and output terminal 3 and second conductor 70b disposed between second power supply terminal 2 and output terminal 3 are provided to face each other in the Z direction. Thus, the inductance in each of a wiring portion connecting first power supply terminal 1 to output terminal 3 and a wiring portion connecting second power supply terminal 2 to output terminal 3 is reduced as compared with semiconductor devices 101 and 102.

Fourth Embodiment

Figure 22:
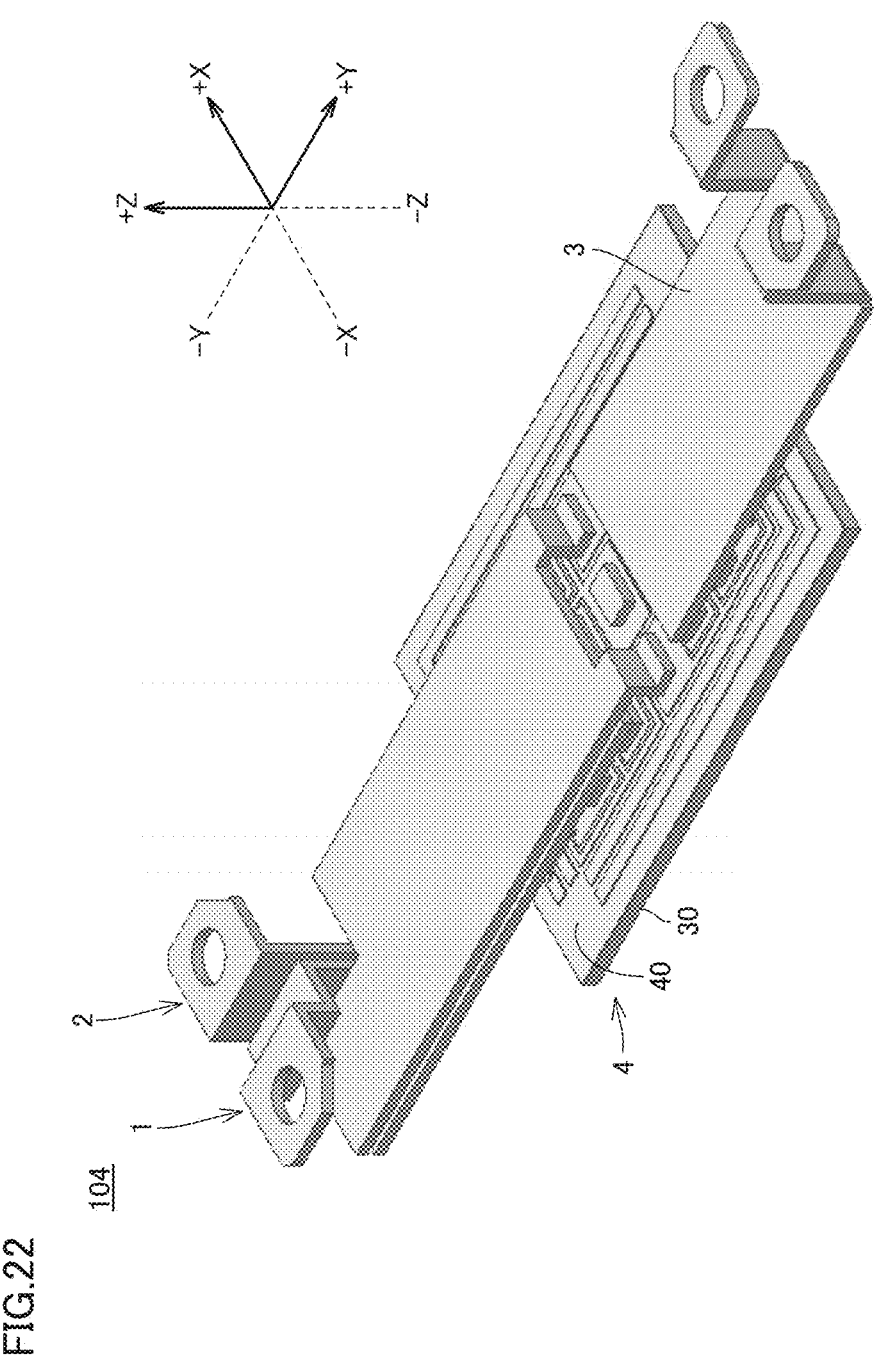
FIG. 22 is a perspective view of a semiconductor device according to a fourth embodiment.
Figure 23:
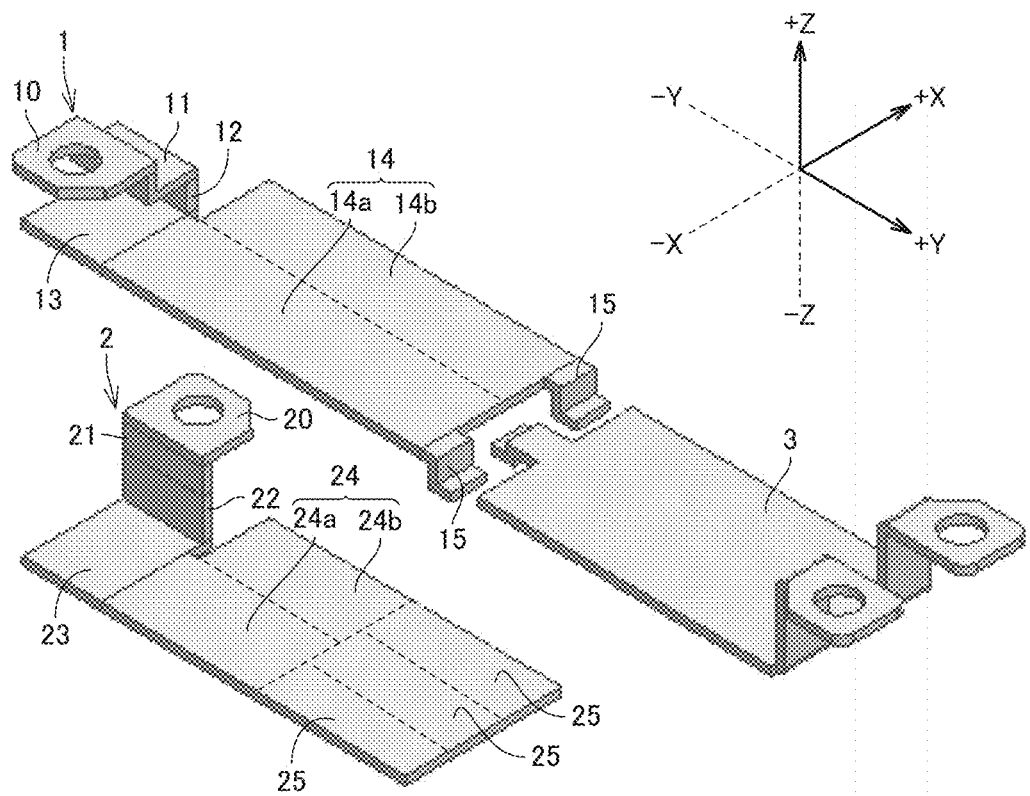
FIG. 23 is an exploded perspective view of a first power supply terminal and a second power supply terminal shown in FIG. 22.
Figure 23:
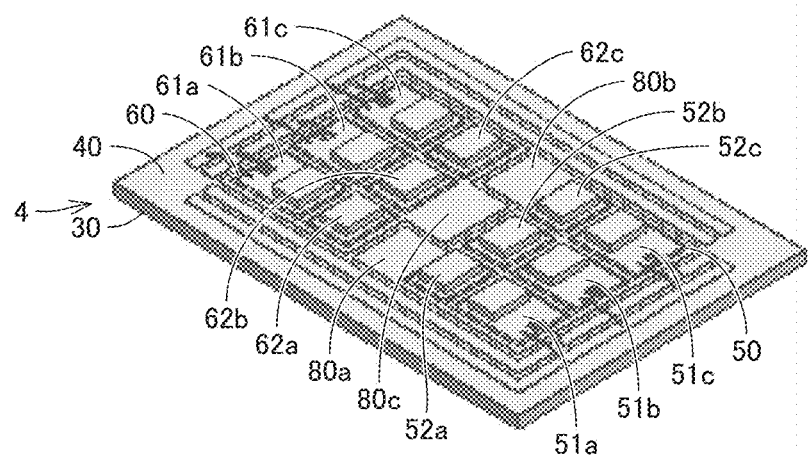
Figure 24:
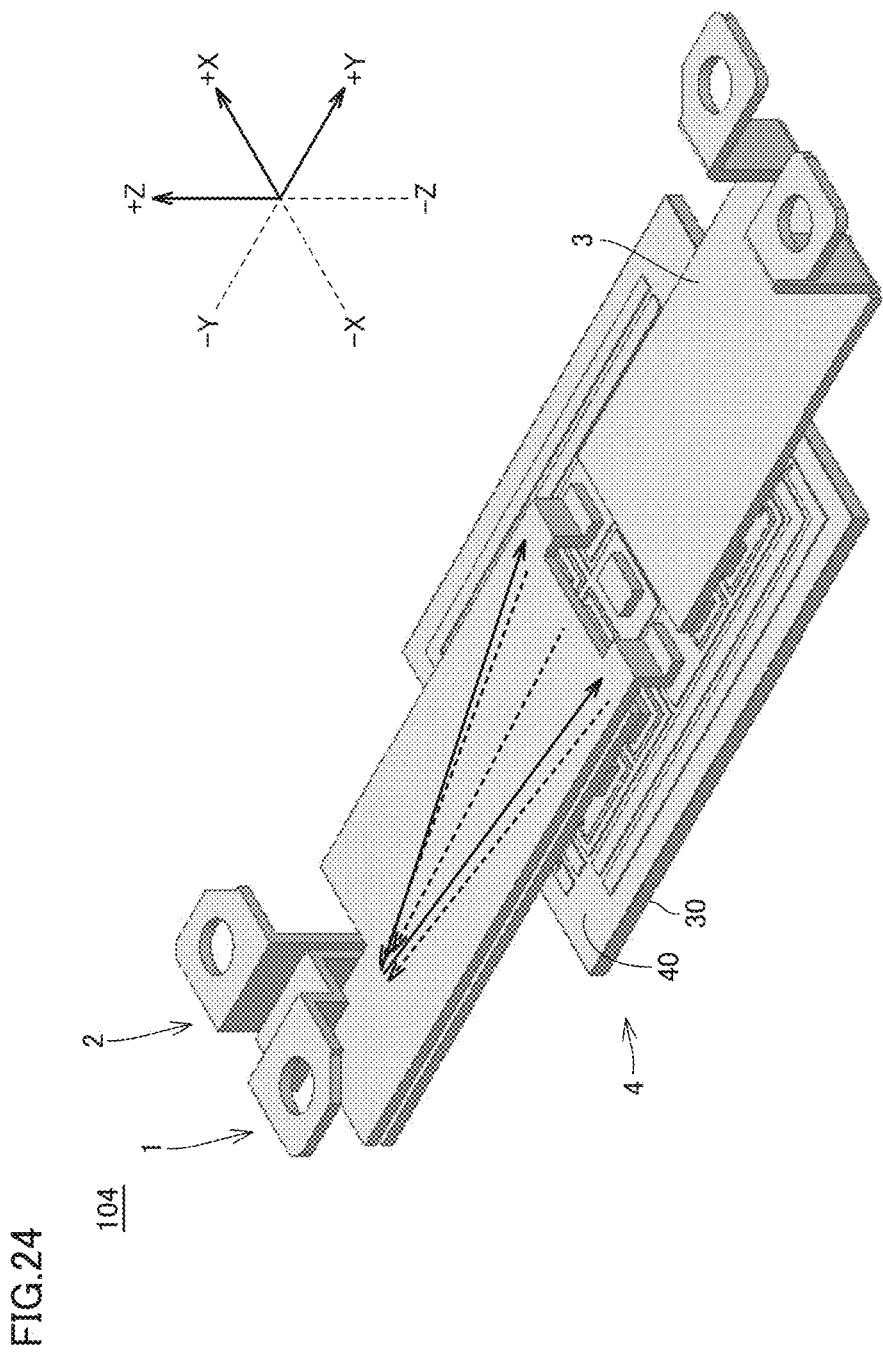
FIG. 24 is a perspective view showing current paths through the first power supply terminal and the second power supply terminal shown in FIG. 22.
Figure 25:
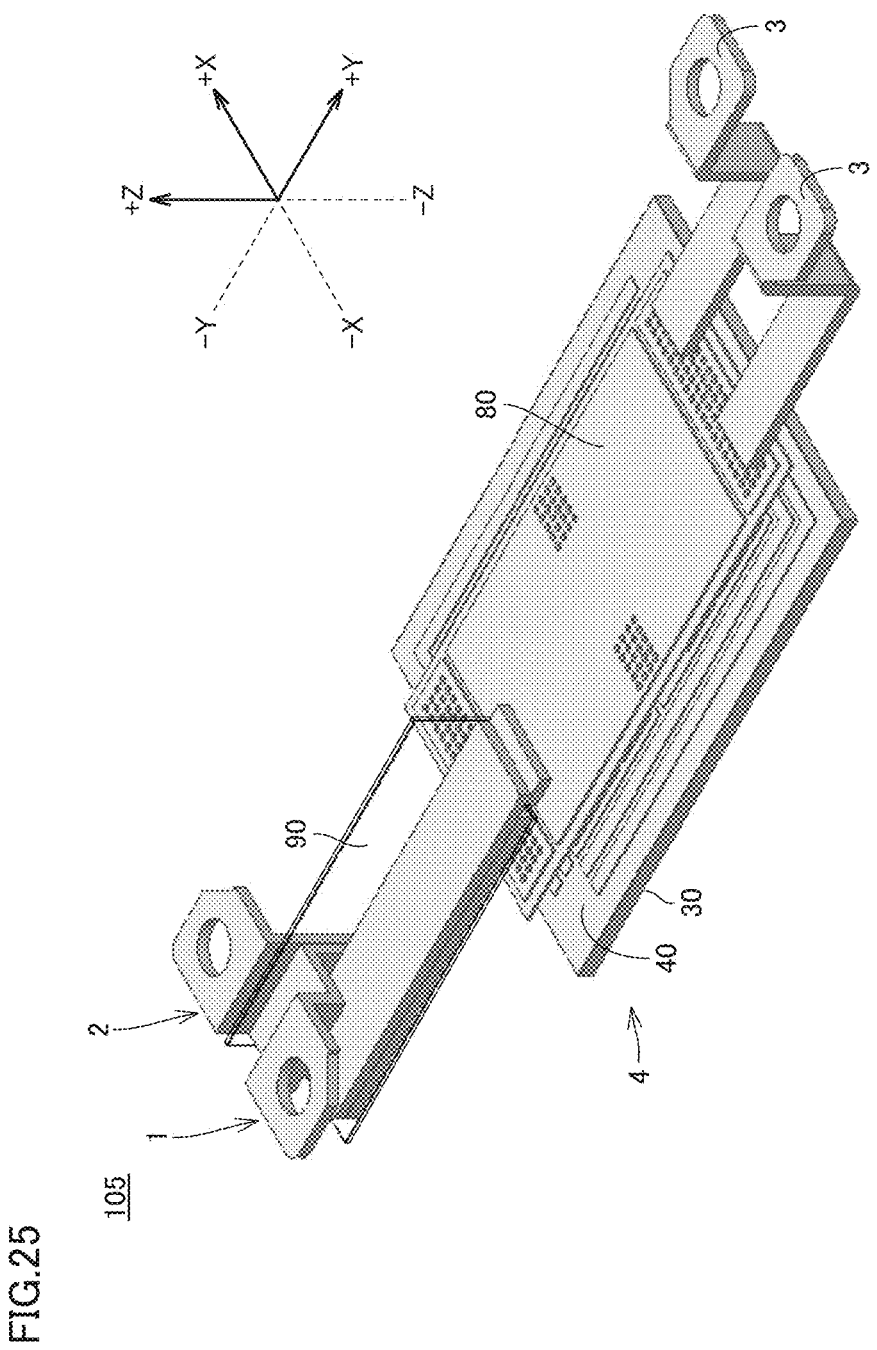
FIG. 25 is a perspective view of a semiconductor device according to a fifth embodiment.
Figure 26:
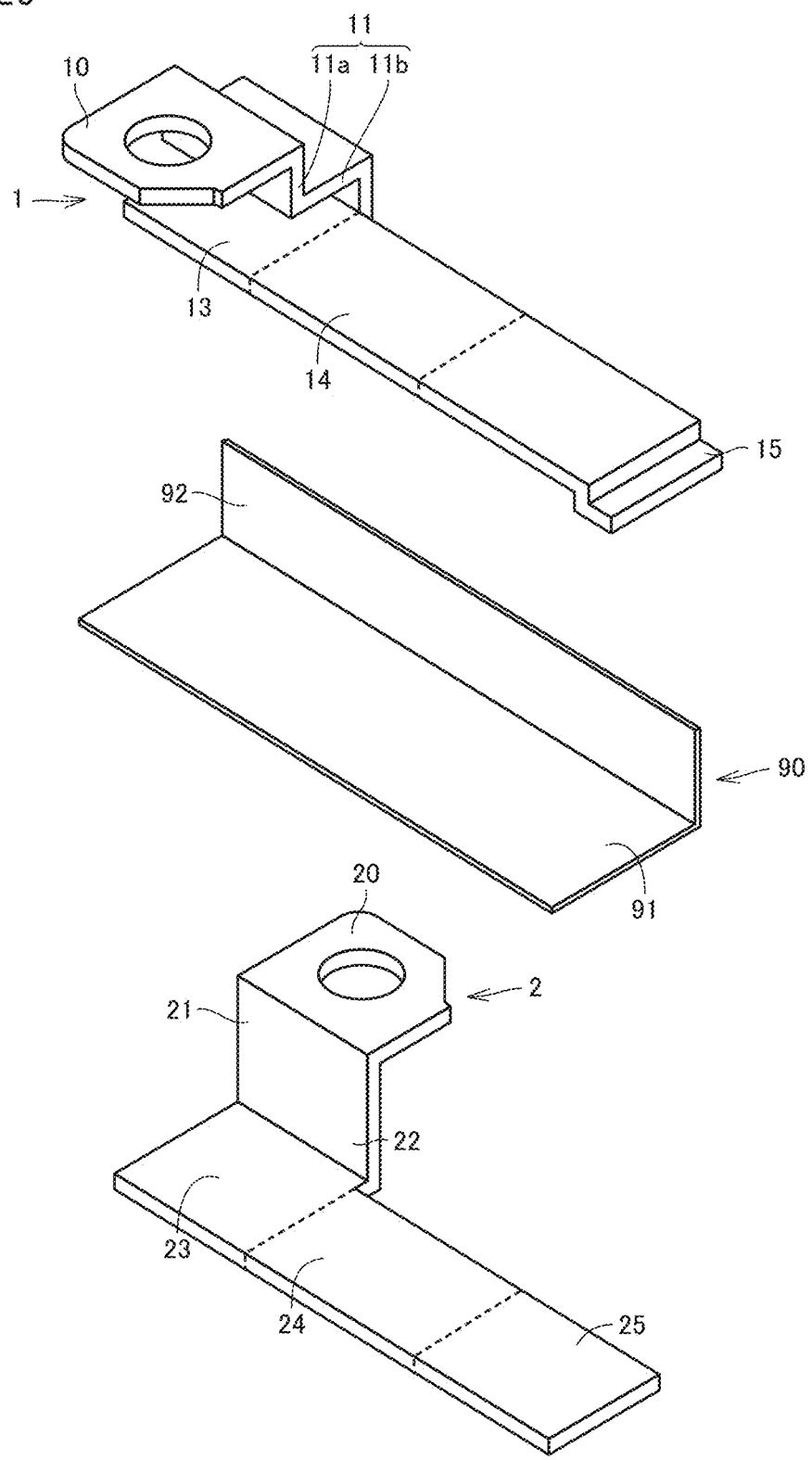
FIG. 26 is an exploded perspective view of a first power supply terminal, a second power supply terminal, and an insulating member shown in FIG. 25.

As shown in FIGS. 22 to 24, a semiconductor device 104 according to the fourth embodiment is basically similar in configuration to semiconductor device 103 according to the third embodiment, but is different from semiconductor device 103 in that first power supply terminal 1, second power supply terminal 2, and output terminal 3 are connected to respective members on base plate 4 without printed circuit board 80 interposed therebetween.

Each of the drains of the plurality of first switching elements 51a to 51c and each of the cathodes of the plurality of first diode elements 52a to 52c are connected to first power supply terminal 1 through first conductor pattern 50, first pad 80a, and second pad 80b. Each of the sources of the plurality of first switching elements 51a to 51c and each of the anodes of the plurality of first diode elements 52a to 52c are directly connected to output terminal 3.

First power supply terminal 1 includes a plurality of first internal connection portions 15 each connected to a corresponding one of first pad 80a and second pad 80b. The plurality of first internal connection portions 15 are arranged side by side in the X direction. The plurality of first internal connection portions 15 are spaced apart, for example, in the X direction, from each other. The plurality of first internal connection portions 15 are connected to the +Y directional side end of fourth portion 14.

Fourth portion 14 has: a first region 14a contiguous to third portion 13 in the Y direction; and a second region 14b extending in the X direction with respect to first region 14a. First region 14a is connected to at least one of the plurality of first internal connection portions 15. Second region 14b is connected to at least another one of the plurality of first internal connection portions 15. Second region 14b protrudes in the direction opposite to first external connection portion 10 with respect to third portion 13 in the X direction.

The drains of the plurality of second switching elements 61a to 61c and the cathodes of the plurality of second diode elements 62a to 62c are connected to output terminal 3 through second conductor pattern 60 and third pad 80c. The sources of the plurality of second switching elements 61a to 61c and the anodes of the plurality of second diode elements 62a to 62c are directly connected to second power supply terminal 2.

Second power supply terminal 2 includes a plurality of second internal connection portions 25 connected to the respective sources of the plurality of second switching elements 61a to 61c and the respective anodes of the plurality of second diode elements 62a to 62c. Seventh portion 24 and the plurality of second internal connection portions 25 are formed in the shape of one flat plate, for example. The plurality of second internal connection portions 25 are arranged side by side in the X direction. The plurality of second internal connection portions 25 are connected to the +Y directional side end of seventh portion 24. The plurality of second internal connection portions 25 each may have a shape protruding in the Z direction with respect to seventh portion 24, like the plurality of second internal connection portions according to the third embodiment shown in FIGS. 14 to 21.

Seventh portion 24 has: a third region 24a contiguous to sixth portion 23 in the Y direction; and a fourth region 24b extending in the X direction with respect to third region 24a. Third region 24a is connected to at least one of the plurality of second internal connection portions 25. Fourth region 24b is connected to at least another one of the plurality of second internal connection portions 25. For example, all of second internal connection portions 25 connected to the respective sources of the second switching elements 61a and some of second internal connection portions 25 connected to the respective sources of second switching elements 61b are connected to the +Y directional side end of fourth region 24b, and remaining second internal connection portions 25 connected to the respective sources of second switching elements 61b and all of second internal connection portions 25 connected to the respective sources of second switching elements 61c are connected to the +Y directional side end of fourth region 24b. Fourth region 24b protrudes toward second external connection portion with respect to sixth portion 23 in the X direction.

First region 14a and third region 24a face each other at a distance from each other in the Z direction. Second region 14b and fourth region 24b face each other at a distance from each other in the Z direction.

In other words, first power supply terminal 1 of semiconductor device 104 is basically similar in configuration to first power supply terminal 1 of semiconductor device 103, but is different from first power supply terminal 1 of semiconductor device 103 in that it includes a plurality of first internal connection portions 15 arranged side by side in the X direction and fourth portion 14 extends in the X direction. Second power supply terminal 2 of semiconductor device 104 is basically similar in configuration to second power supply terminal 2 of semiconductor device 103, but is different from second power supply terminal 2 of semiconductor device 103 in that it includes a plurality of second internal connection portions 25 arranged side by side in the X direction and seventh portion 24 extends in the X direction. In other words, the configurations of semiconductor device 104 other than fourth portion 14 and first internal connection portion 15 of first power supply terminal 1 as well as seventh portion 24 and second internal connection portion 25 of second power supply terminal 2 are similar to those of semiconductor device 103. Thus, when a current is applied to flow through semiconductor device 104 in the state where first power supply terminal 1 is connected to the positive electrode of the external power supply and second power supply terminal 2 is connected to the negative electrode of the external power supply, the current paths formed in first external connection portion 10, first portion 11, second portion 12, third portion 13, second external connection portion 20, fifth portions 21, 22, and sixth portion 23 are the same as those in semiconductor device 103.

FIG. 24 shows arrows indicating current paths formed in fourth portion 14 and seventh portion 24 when a current is applied to flow through semiconductor device 104 in the state where first power supply terminal 1 is connected to the positive electrode of the external power supply and second power supply terminal 2 is connected to the negative electrode of the external power supply.

As shown in FIG. 24, in semiconductor device 104, a plurality of current paths "e" extending from third portion 13 to the respective first internal connection portions are formed in fourth portion 14. Similarly, a plurality of current paths "p" extending from sixth portion 23 to the respective second internal connection portions are formed in seventh portion 24. Each current path "e" is disposed in parallel to each current path "q" and is opposite in current flowing direction to each current path "q".

Since semiconductor device 104 is basically similar in configuration to semiconductor device 103, the effects similar to those achieved by semiconductor devices 101, 102, and 103 can be achieved. Further, in semiconductor device 104, first power supply terminal 1 has the plurality of first internal connection portions 15 and second power supply terminal 2 has the plurality of second internal connection portions 25, and also, the plurality of current paths formed thereby are provided in parallel to each other and opposite in current flowing direction to each other between first power supply terminal 1 and second power supply terminal 2. Thereby, the inductances in first power supply terminal 1 and second power supply terminal 2 are reduced.

When semiconductor devices 104 and 103 are configured to include base plate 4 having approximately the same configuration, the portion of semiconductor device 104 where fourth portion 14 and seventh portion 24 face each other extend widely in the X direction and the Y direction, like the portion of semiconductor device 103 where first conductor 50a and second conductor 70b face each other. Thus, in semiconductor device 104, the inductance in each of the wiring portion connecting first external connection portion 10 of first power supply terminal 1 to output terminal 3 and the wiring portion connecting second external connection portion 20 of second power supply terminal 2 to output terminal 3 is reduced to approximately the same level as that in semiconductor device 103, irrespective of printed circuit board 80.

In semiconductor device 104, first region 14a and third region 24a face each other at a distance from each other in the Z direction, and second region 14b and fourth region 24b face each other at a distance from each other in the Z direction. In other words, the portion of semiconductor device 104 where fourth portion 14 and seventh portion 24 face each other includes a portion where second region 14b and fourth region 24b face each other, and thereby, extends correspondingly wider than the portion where fourth portion 14 and seventh portion 24 face each other in each of semiconductor devices 101, 102, and 103. Therefore, in semiconductor device 104, the inductances in first power supply terminal 1 and second power supply terminal 2 are reduced as compared with those in semiconductor devices 101, 102, and 103.

Fifth Embodiment

As shown in FIGS. 25 to 28, a semiconductor device 105 according to the fifth embodiment is basically similar in configuration to semiconductor device 103 according to the third embodiment, but is different from semiconductor device 103 in that it further includes an insulating member 90 disposed between second power supply terminal 2 and each of the first facing portion and the second facing portion of first power supply terminal 1. Semiconductor device 105 may be similar in configuration to semiconductor device 101, 102, or 104 except for the above-mentioned point.

Insulating member 90 includes a first insulating portion 91 and a second insulating portion 92. First insulating portion 91 extends in the X direction and the Y direction. Second insulating portion 92 extends in the Z direction and the Y direction. A +X directional side end of first insulating portion 91 is connected to a −Z directional side end of second insulating portion 92. First insulating portion 91 and second insulating portion 92 are integrally formed, for example.

Figure 27:
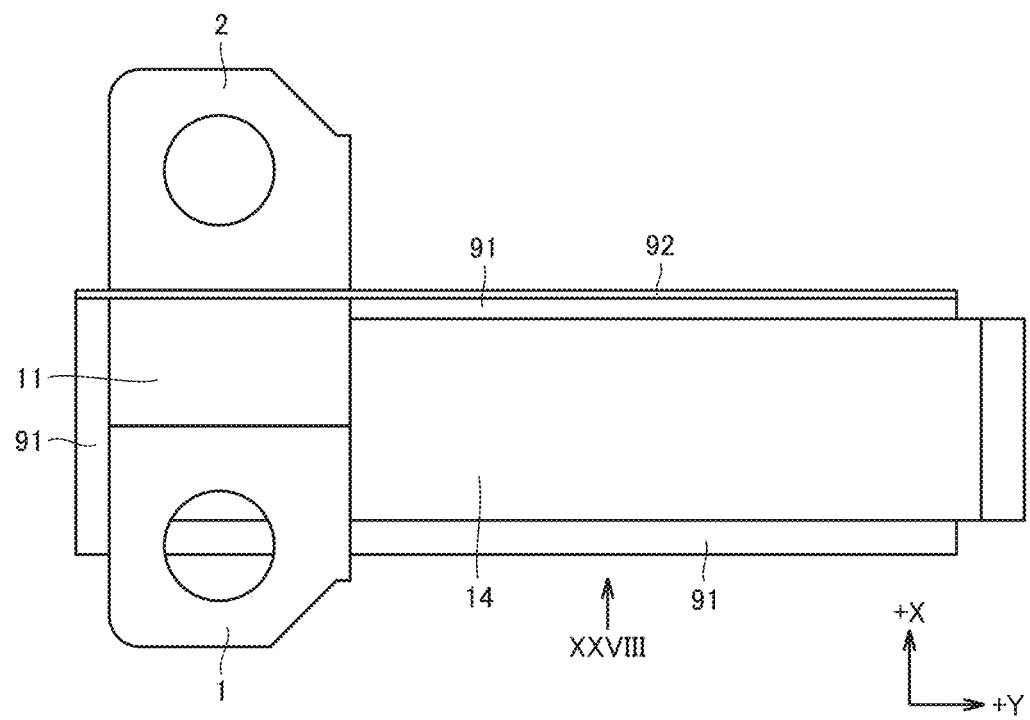
FIG. 27 is a plan view of the first power supply terminal, the second power supply terminal, and the insulating member shown in FIG. 25.
Figure 28:
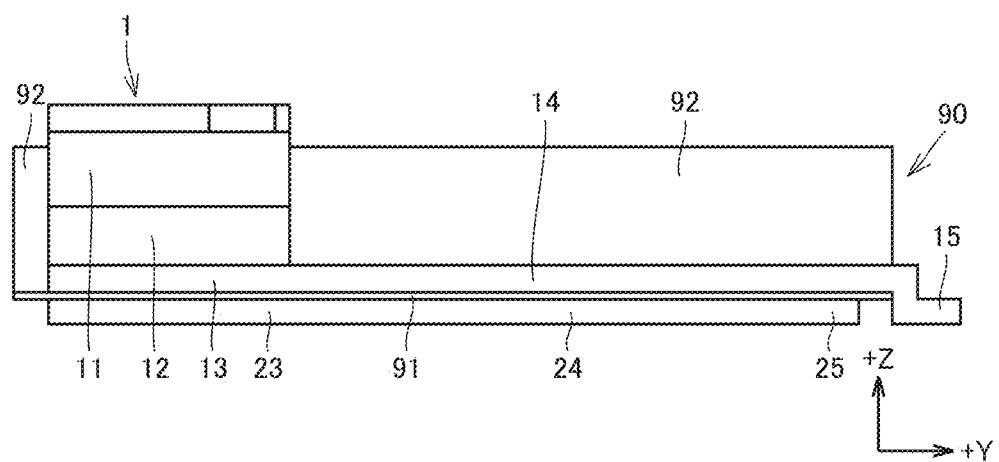
FIG. 28 is a side view of the first power supply terminal, the second power supply terminal, and the insulating member shown in FIG. 25.

First insulating portion 91 is disposed between first power supply terminal 1 and second power supply terminal 2 in the Z direction. As shown in FIGS. 27 and 28, first insulating portion 91 of insulating member 90 has: an intermediate portion that is disposed between third portion 13 and sixth portion 23, between fourth portion 14 and seventh portion 24, and between first internal connection portion 15 and second internal connection portion 2; and an extending portion that extends from the intermediate portion in the X direction or the Y direction. In FIG. 27, the latter extending portion of first insulating portion 91 is disposed in first insulating portion 91 outside first power supply terminal 1 and second power supply terminal 2. The latter extending portion of first insulating portion 91 is provided from the viewpoint of increasing the creepage insulation distance between first power supply terminal 1 and second power supply terminal 2.

Second insulating portion 92 is disposed between first power supply terminal 1 and second power supply terminal 2 in the X direction. As shown in FIGS. 27 and 28, second insulating portion 92 of insulating member 90 has: an intermediate portion that is disposed between first external connection portion 10 and second external connection portion 20, between first portion 11 and second upright portion 21, and between second portion 12 and third upright portion 22; and an extending portion that extends from the intermediate portion in the Z direction or the Y direction. In FIG. 28, the latter extending portion is disposed outside first power supply terminal 1 and second power supply terminal 2. The latter extending portion of second insulating portion 92 is provided from the viewpoint of increasing the creepage insulation distance between first power supply terminal 1 and second power supply terminal 2.

The material of insulating member 90 may be any material having electrical insulating properties, and may include polyimide or polyetheretherketone. The material of insulating member 90 is lower in electrical conductivity than air. The thickness of insulating member 90, i.e., the thickness of first insulating portion 91 in the Z direction and the thickness of second insulating portion 92 in the X direction, is not particularly limited as long as insulating member 90 has electrical insulating properties equal to or higher than the rated voltage of semiconductor device 105.

The surface of insulating member 90 that faces first power supply terminal 1 and second power supply terminal 2 has adhesiveness, for example. First insulating portion 91 has, for example, a base layer extending in the X direction and the Y direction, and two adhesive layers disposed to sandwich the base layer therebetween. Second insulating portion 92 has, for example, a base layer extending in the Z direction and the Y direction, and two adhesive layers disposed to sandwich the base layer therebetween. The base layer and the adhesive layers are formed such that insulating member 90 has the above-mentioned electrical insulating properties. Each adhesive layer is bonded to first power supply terminal 1 or second power supply terminal 2.

Since semiconductor device 105 is similar in configuration to semiconductor device 103, the effect similar to that of semiconductor device 103 can be achieved. Further, since semiconductor device 105 includes insulating member 90, the distance between first power supply terminal 1 and second power supply terminal 2 in semiconductor device 105 can be shorter than that in semiconductor device 103 not including insulating member 90. Consequently, the effect of reducing the inductance by semiconductor device 105 is enhanced as compared with that achieved by semiconductor device 103 not including insulating member 90.

Modifications

Each of semiconductor devices 101 to 105 according to the first to fifth embodiments may have the following configuration.

In semiconductor devices 101 to 105, as long as first portion 11 and third portion 13 of first power supply terminal 1 and the sixth portion of second power supply terminal 2 are stacked in the Z direction to be formed in a parallel plate, other configurations are not particularly limited. For example, first external connection portion 10, first portion 11, second portion 12, and third portion 13 may be different in width in the Y direction. Further, the sum of the lengths of first portion 11 and third portion 13 in the X direction may be shorter than the sum of the lengths of first portion 11 and second portion 12 in the Z direction.

Figure 29:
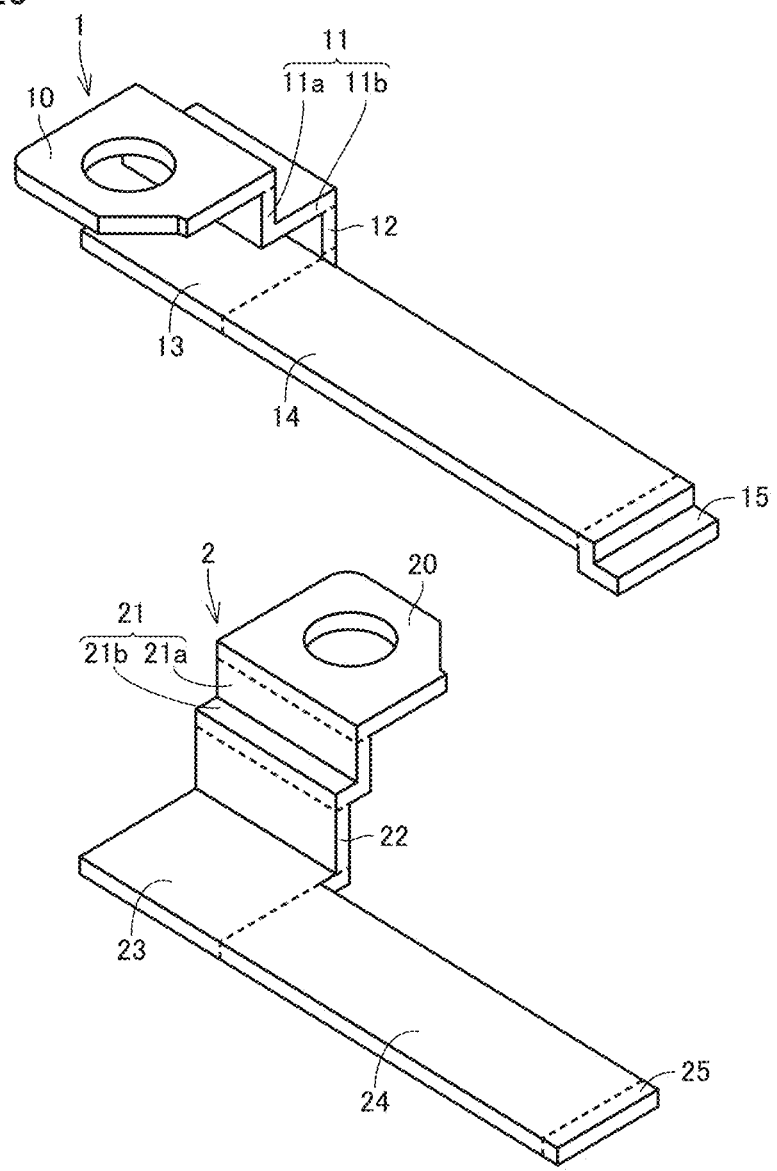
FIG. 29 is an exploded perspective view showing a modification of the first power supply terminal and the second power supply terminal according to the first to fifth embodiments.

In second power supply terminal 2 in each of semiconductor devices 101 to 105, fifth portions 21 and 22 connecting second external connection portion 20 and sixth portion 23 entirely extend in the Z direction, but the present invention is not limited thereto. As shown in FIG. 29, second upright portion 21 of fifth portions 21 and 22 may have a vertically extending portion 21a extending in the Z direction and a horizontally extending portion 21b extending in the X direction.

As shown in FIG. 29, a +Z directional side end as one end of vertically extending portion 21a in the Z direction may be connected to a –X directional side end as one end of second external connection portion 20 in the X direction. A –Z directional side end as the other end of vertically extending portion 21a in the Z direction may be connected to a +X directional side end as one end of horizontally extending portion 21b in the X direction. A –X directional side end as the other end of horizontally extending portion 21b in the X direction may be connected to a +Z directional side end as one end of third upright portion 22 in the Z direction.

At least apart of horizontally extending portion 21b may be disposed to face horizontally extending portion 11b of first power supply terminal 1. At least a part of vertically extending portion 21a may be disposed to face first upright portion 11a of first power supply terminal 1. In other words, the –Z directional side end as the other end of vertically extending portion 21a in the Z direction may be connected to the –X directional side end as one end of horizontally extending portion 21b in the X direction.

In semiconductor devices 101 to 105, first power supply terminal 1 is configured as a positive electrode terminal and second power supply terminal 2 is configured as a negative electrode terminal, but the present invention is not limited thereto. First power supply terminal 1 may be configured as a negative electrode terminal, and second power supply terminal 2 may be configured as a positive electrode terminal. In other words, first internal connection portion 15 of first power supply terminal 1 may be connected to second switching elements 61a to 61c through third conductor pattern 70. Second internal connection portion 25 of second power supply terminal 2 may be connected to first switching elements 51a to 51c through first conductor pattern 50.

In each of semiconductor devices 101 to 105, first power supply terminal 1 and second power supply terminal 2 may be line-symmetrical about a straight line extending in the Y direction with respect to first power supply terminal 1 and second power supply terminal 2 shown in each of the figures.

In each of semiconductor devices 101 to 105, first upright portion 11a and second portion 12 of first power supply terminal 1 and fifth portions 21 and 22 of second power supply terminal 2 extend in the Z direction. In the present specification, the configuration in which a specific member extends in a specific direction is not limited to a configuration in which a specific member extends in parallel to the specific direction, but indicates a configuration in which a specific member extends at an angle of 10 degrees or less with respect to the specific direction. First upright portion 11a and second portion 12 of first power supply terminal 1 and fifth portions 21 and 22 of second power supply terminal 2 may be inclined at an angle of more than 10 degrees with respect to the Z direction.

In each of semiconductor devices 101 to 105, the semiconductor material forming first switching elements 51a to 51c and second switching elements 61a to 61c includes SiC, but the present invention is not limited thereto. Preferably, the semiconductor material forming first switching elements 51a to 51c and second switching elements 61a to 61c may be any material having a band gap wider than that of silicon (Si). For example, the semiconductor material forming first switching elements 51a to 51c and second switching elements 61a to 61c includes at least one selected from the group consisting of SiC, gallium nitride (GaN), and diamond (C). The semiconductor material forming first switching elements 51a to 51c and second switching elements 61a to 61c may be Si.

Sixth Embodiment

In the present embodiment, semiconductor devices 101 to 105 according to the above-described first to fifth embodiments are applied to a power conversion device. The power conversion device according to the present embodiment is not limited to a specific power conversion device, and the following describes the case where the present invention is applied to a three-phase inverter as the sixth embodiment.

Figure 30:
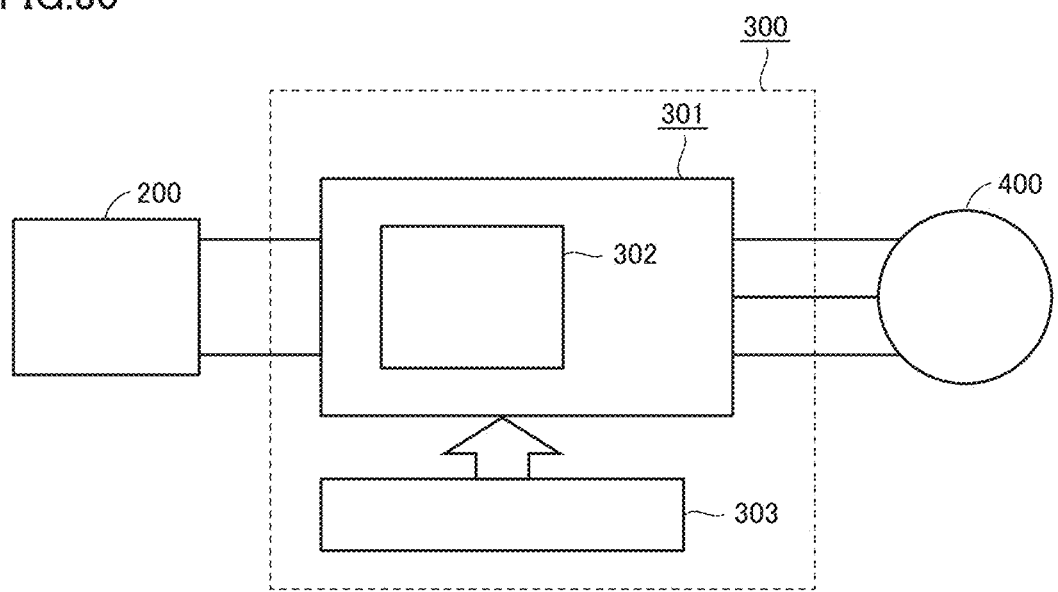
FIG. 30 is a block diagram showing a configuration of a power conversion system to which a power conversion device according to a sixth embodiment is applied.

FIG. 30 is a block diagram showing a configuration of a power conversion system to which a power conversion device according to the present embodiment is applied.

The power conversion system shown in FIG. 30 includes a power supply 200, a power conversion device 300, and a load 400. Power supply 200 is a direct-current (DC) power supply and supplies DC power to power conversion device 300. Power supply 200 can be formed of various types of devices, and may be formed of a DC system, a photovoltaic cell, or a storage battery, for example, or may be formed of a rectifier circuit connected to an alternating-current (AC) system or formed of an AC/DC converter. Also, power supply 200 may be formed of a DC/DC converter that converts DC power output from the DC system into predetermined power.

Power conversion device 300, which is a three-phase inverter connected between power supply 200 and load 400, converts the DC power supplied from power supply 200 into AC power, and supplies the converted AC power to load 400. As shown in FIG. 30, power conversion device 300 includes: a main conversion circuit 301 that converts DC power into AC power and outputs the converted AC power; and a control circuit 303 that outputs a control signal for controlling main conversion circuit 301 to main conversion circuit 301.

Load 400 is a three-phase electric motor driven by AC power supplied from power conversion device 300. Load 400 is not limited to a specific application, but is an electric motor mounted on each of various electric devices and used as an electric motor, for example, for a hybrid vehicle, an electric vehicle, a rolling stock, an elevator, or an air conditioner.

The following describes the details of power conversion device 300. Main conversion circuit 301 includes a switching element and a freewheeling diode (each of which is not shown). By switching of the switching element, the DC power supplied from power supply 200 is converted into AC power and supplied to load 400. While main conversion circuit 301 may be configured specifically in various manners, main conversion circuit 301 according to the present embodiment is a three-phase full bridge circuit configured in two levels, and may be formed of six switching elements and six freewheeling diodes that are connected in antiparallel to the respective six switching elements. Main conversion circuit 301 includes a semiconductor device 302 corresponding to any one of semiconductor devices 101 to 105 according to the above-described first to fifth embodiments. Each switching element and each freewheeling diode of main conversion circuit 301 include a plurality of first switching elements 51a to 51c, a plurality of second switching elements 61a to 61c, first diode elements 52a to 52c, and second diode elements 62a to 62c according to the above-described first to fifth embodiments. Six switching elements are configured such that each two switching elements are connected in series to form an upper arm and a lower arm. Each of the pairs of upper and lower arms forms a corresponding phase (a U-phase, a V-phase, and a W-phase) of a full bridge circuit. The output terminals of the upper and lower arms, that is, three output terminals of main conversion circuit 301, are connected to load 400.

Further, main conversion circuit 301 includes a drive circuit (not shown) for driving each switching element, but the drive circuit may be incorporated in semiconductor device 302 or may be configured to include a drive circuit separately from semiconductor device 302. The drive circuit generates a drive signal for driving each switching element in main conversion circuit 301, and supplies the generated drive signal to the control electrode of each switching element in main conversion circuit 301. Specifically, according to the control signal from a control circuit 303 described later, the drive circuit outputs the drive signal for turning on each switching element and the drive signal for turning off each switching element to the control electrode of each switching element. When the switching element is maintained in an ON state, the drive signal is a voltage signal (an ON signal) equal to or greater than a threshold voltage of the switching element. When the switching element is maintained in an OFF state, the drive signal is a voltage signal (an OFF signal) equal to or less than the threshold voltage of the switching element.

Control circuit 303 controls each switching element in main conversion circuit 301 to supply desired electric power to load 400. Specifically, the time (ON time) at which each switching element in main conversion circuit 301 is to be in an ON state is calculated based on the electric power to be supplied to load 400. For example, control circuit 303 can control main conversion circuit 301 by pulse width modulation (PWM) control for modulating the ON time of each switching element according to the voltage to be output. Then, control circuit 303 outputs a control command (control signal) to the drive circuit included in main conversion circuit 301 such that an ON signal is output to the switching element that is to be in an ON state at each point of time and such that an OFF signal is output to the switching element that is to be in an OFF state at each point of time. According to this control signal, the drive circuit outputs an ON signal or an OFF signal as a drive signal to the control electrode of each switching element.

In the power conversion device according to the present embodiment, main conversion circuit 301 includes one of semiconductor devices 101 to 105 according to the first to fifth embodiments as semiconductor device 302, so that the reliability of the power conversion device can be improved.

The present embodiment has been described with regard to a three-phase inverter configured in two levels as an example to which semiconductor devices 101 to 105 according to the first to fifth embodiments are applied, but such an example to which semiconductor devices 101 to 105 according to the first to fifth embodiments are applied is not limited thereto and is applicable to various types of power conversion devices. In the present embodiment, the power conversion device is configured in two levels, but the power conversion device may be configured in three levels or in a multilevel. When electric power is supplied to a single-phase load, the present invention may be applied to a single-phase inverter. Also, when electric power is supplied to a DC load or the like, the present invention may also be applicable to a DC/DC converter or an AC/DC converter.

Further, the power conversion device according to the present embodiment is not limited to the case where the above-mentioned load is an electric motor, but may also be used as a power supply device for an electrical discharge machine, a laser drilling machine, an induction heating cooker, or a wireless power transfer system, or may also be used as a power conditioner for a photovoltaic power system, a power storage system, or the like.

Although the embodiments of the present invention have been described above, the above-described embodiments may be variously modified. The scope of the present invention is not limited to the above-described embodiments. Further, the scope of the present invention is defined by the terms of the claims, and is intended to include any modifications within the meaning and scope equivalent to the terms of the claims.

REFERENCE SIGNS LIST

1 first power supply terminal, 2 second power supply terminal, 3 output terminal, 4 base plate, 10 first external connection portion, 11, 12, 13, 14 first intermediate connection portion, 11 first portion, 11a first upright portion, 11b, 21b horizontally extending portion, 12 second portion, 13 third portion, 14 fourth portion, 14a first region, 14b second region, 15 first internal connection portion, 20 second external connection portion, 21, 22 fifth portion, 21 second upright portion, 21, 22, 23, 24 second intermediate connection portion, 21a vertically extending portion, 22 third upright portion, 23 sixth portion, 24 seventh portion, 24a third region, 24b fourth region, 25 second internal connection portion, 30 substrate, 40 insulating layer, 50 first conductor pattern, 50a first conductor, 50b fifth conductor, 50c sixth conductor, 51a, 51c first switching element, 52a, 52c first diode element, 60 second conductor pattern, 60a third conductor, 60b seventh conductor, 61a, 61b, 61c second switching element, 62a, 62b, 62c second diode element, 70 third conductor pattern, 70a fourth conductor, 70b second conductor, 80 printed circuit board, 80a first pad, 80b second pad, 80c third pad, 90 insulating member, 91 first insulating portion, 92 second insulating portion, 101, 102, 103, 104, 105, 302 semiconductor device, 200 power supply, 301 main conversion circuit, 300 power conversion device, 303 control circuit, 400 load.

The invention claimed is:

1. A semiconductor device comprising: a first power supply terminal; a second power supply terminal; an output terminal; at least one first switching element connected between the first power supply terminal and the output terminal; and at least one second switching element connected between the second power supply terminal and the output terminal, wherein
   the first power supply terminal includes
      a first facing portion disposed at a distance from the second power supply terminal in a first direction and disposed to extend in a second direction crossing the first direction,
      a second facing portion disposed at a distance from the second power supply terminal in the second direction and disposed to extend in the first direction, and
      a third facing portion disposed at a distance from the second facing portion in the second direction and disposed to extend in the first direction,
   the first facing portion and the second facing portion are provided such that, upon application of a current, the current flows through the first facing portion and the second facing portion in a direction opposite to a direction in which the current flows through each of portions in the second power supply terminal that face the first facing portion and the second facing portion, and
   the second facing portion and the third facing portion are provided such that, upon application of a current, the current flows through the second facing portion in a direction opposite to a direction in which the current flows through the third facing portion,
   the first power supply terminal further includes
      a first external connection portion connected to outside, and
      a first upright portion extending in the second direction,
   one end of the first upright portion in the second direction is connected to one end of the first external connection portion in the first direction,
   the other end of the first upright portion in the second direction is connected to one end of the third facing portion in the first direction, and
   the other end of the third facing portion in the first direction is connected to one end of the first facing portion in the second direction.

2. The semiconductor device according to claim 1, wherein the second facing portion and the third facing portion are connected with the first facing portion interposed therebetween.

3. The semiconductor device according to claim 2, wherein the second facing portion has a portion contiguous to the first facing portion in the first direction.

4. The semiconductor device according to claim 3, wherein
   the first power supply terminal includes
      at least one first internal connection portion connected to the at least one first switching element, and
      a first intermediate connection portion to connect the first external connection portion and the at least one first internal connection portion,
   the first intermediate connection portion has
      a first portion connected to the first external connection portion and extending in the first direction,
      a second portion connected to the first portion and extending in the second direction,
      a third portion connected to the second portion and extending in the first direction, and
      a fourth portion connecting the third portion and the at least one first internal connection portion and extending in a third direction crossing the first direction and the second direction,
   the second power supply terminal includes
      a second external connection portion to be connected to outside,
      at least one second internal connection portion connected to the at least one second switching element, and
      a second intermediate connection portion to connect the second external connection portion and the at least one second internal connection portion,
   the second intermediate connection portion has
      a fifth portion connected to the second external connection portion and extending in the second direction,
      a sixth portion connected to the fifth portion and extending in the first direction, and
      a seventh portion connecting the sixth portion and the at least one second internal connection portion and extending in the third direction,
   the first facing portion has the second portion,
   the second facing portion has the third portion and the fourth portion, and
   the third facing portion has at least a part of the first portion.

5. The semiconductor device according to claim 4, wherein
   the first power supply terminal further includes a fourth facing portion to face the second power supply terminal at a distance from the second power supply terminal in the third direction, and
   the fourth facing portion includes at least a part of the at least one first internal connection portion.

6. The semiconductor device according to claim 2, wherein
   the first power supply terminal includes
      at least one first internal connection portion connected to the at least one first switching element, and
      a first intermediate connection portion to connect the first external connection portion and the at least one first internal connection portion,
   the first intermediate connection portion has
      a first portion connected to the first external connection portion and extending in the first direction,
      a second portion connected to the first portion and extending in the second direction, a third portion connected to the second portion and
extending in the first direction, and
a fourth portion connecting the third portion and the at
least one first internal connection portion and extending in a third direction crossing the first direction and
the second direction,
the second power supply terminal includes
a second external connection portion to be connected to
outside,
at least one second internal connection portion connected to the at least one second switching element,
and
a second intermediate connection portion to connect the
second external connection portion and the at least
one second internal connection portion,
the second intermediate connection portion has
a fifth portion connected to the second external connection portion and extending in the second direction,
a sixth portion connected to the fifth portion and
extending in the first direction, and
a seventh portion connecting the sixth portion and the
at least one second internal connection portion and
extending in the third direction,
the first facing portion has the second portion,
the second facing portion has the third portion and the
fourth portion, and
the third facing portion has at least a part of the first
portion.

7. The semiconductor device according to claim 6,
wherein
the first power supply terminal further includes a fourth
facing portion to face the second power supply terminal
at a distance from the second power supply terminal in
the third direction, and
the fourth facing portion includes at least a part of the at
least one first internal connection portion.

8. The semiconductor device according to claim 2, further
comprising:
a first conductor to connect the first power supply terminal
and the at least one first switching element; and
a second conductor to connect the second power supply
terminal and the at least one second switching element,
wherein
the first conductor and the second conductor are disposed
at a distance from each other and provided such that,
upon application of a current, the current flows through
the first conductor in a direction opposite to a direction
in which the current flows through the second conductor.

9. The semiconductor device according to claim 1,
wherein the second facing portion has a portion contiguous
to the first facing portion in the first direction.

10. The semiconductor device according to claim 1,
wherein
the first power supply terminal includes
at least one first internal connection portion connected
to the at least one first switching element, and
a first intermediate connection portion to connect the
first external connection portion and the at least one
first internal connection portion,
the first intermediate connection portion has
a first portion connected to the first external connection
portion and extending in the first direction,
a second portion connected to the first portion and
extending in the second direction,
a third portion connected to the second portion and
extending in the first direction, and
a fourth portion connecting the third portion and the at
least one first internal connection portion and extending in a third direction crossing the first direction and
the second direction,
the second power supply terminal includes
a second external connection portion to be connected to
outside,
at least one second internal connection portion connected to the at least one second switching element,
and
a second intermediate connection portion to connect the
second external connection portion and the at least
one second internal connection portion,
the second intermediate connection portion has
a fifth portion connected to the second external connection portion and extending in the second direction,
a sixth portion connected to the fifth portion and
extending in the first direction, and
a seventh portion connecting the sixth portion and the
at least one second internal connection portion and
extending in the third direction,
the first facing portion has the second portion,
the second facing portion has the third portion and the
fourth portion, and
the third facing portion has at least a part of the first
portion.

11. The semiconductor device according to claim 10,
wherein
the first power supply terminal further includes a fourth
facing portion to face the second power supply terminal
at a distance from the second power supply terminal in
the third direction, and
the fourth facing portion includes at least a part of the at
least one first internal connection portion.

12. The semiconductor device according to claim 11,
wherein
the at least one first internal connection portion includes
a plurality of first internal connection portions,
the at least one second internal connection portion
includes a plurality of second internal connection portions,
the first internal connection portions are arranged side by
side in the first direction,
the second internal connection portions are arranged side
by side in the first direction,
each of the first internal connection portions is spaced
apart in the third direction from a corresponding one of
the second internal connection portions, and
the fourth portion connected to each of the first internal
connection portions and the seventh portion connected
to each of the second internal connection portions face
each other at a distance from each other in the second
direction.

13. The semiconductor device according to claim 12,
wherein
the fourth portion includes
a first region contiguous to the third portion in the third
direction, and
a second region extending in the first direction with
respect to the first region, the seventh portion
includes
a third region contiguous to the sixth portion in the third
direction, and a fourth region extending in the first direction with respect to the third region, the first region and the third region face each other at a distance from each other in the second direction, and the second region and the fourth region face each other at a distance from each other in the second direction.

14. The semiconductor device according to claim 10, wherein the at least one first internal connection portion includes a plurality of first internal connection portions, the at least one second internal connection portion includes a plurality of second internal connection portions, the first internal connection portions are arranged side by side in the first direction, the second internal connection portions are arranged side by side in the first direction, each of the first internal connection portions is spaced apart in the third direction from a corresponding one of the second internal connection portions, and the fourth portion connected to each of the first internal connection portions and the seventh portion connected to each of the second internal connection portions face each other at a distance from each other in the second direction.

15. The semiconductor device according to claim 14, wherein the fourth portion includes
- a first region contiguous to the third portion in the third direction, and
- a second region extending in the first direction with respect to the first region, the seventh portion includes
- a third region contiguous to the sixth portion in the third direction, and
- a fourth region extending in the first direction with respect to the third region, the first region and the third region face each other at a distance from each other in the second direction, and the second region and the fourth region face each other at a distance from each other in the second direction.

16. The semiconductor device according to claim 1, further comprising:
- a first conductor to connect the first power supply terminal and the at least one first switching element; and
- a second conductor to connect the second power supply terminal and the at least one second switching element, wherein the first conductor and the second conductor are disposed at a distance from each other and provided such that, upon application of a current, the current flows through the first conductor in a direction opposite to a direction in which the current flows through the second conductor.

17. The semiconductor device according to claim 1, further comprising an insulating member disposed between the second power supply terminal and each of the first facing portion and the second facing portion of the first power supply terminal.

18. The semiconductor device according to claim 1, wherein the at least one first switching element and the at least one second switching element each are a fully controllable power semiconductor element, and a semiconductor material forming the at least one first switching element and the at least one second switching element is wider in band gap than silicon.

19. The semiconductor device according to claim 18, wherein the semiconductor material forming the at least one first switching element and the at least one second switching element includes at least one selected from the group consisting of silicon carbide, gallium nitride, and diamond.

20. A power conversion device comprising:
- a main conversion circuit to convert received electric power and output converted electric power, the main conversion circuit including the semiconductor device according to claim 1; and
- a control circuit to output a control signal for controlling the main conversion circuit to the main conversion circuit.

* * * * *